United States Patent
Yumoto

(10) Patent No.: US 8,101,230 B2
(45) Date of Patent: Jan. 24, 2012

(54) METHOD FOR PRODUCING ELECTRONIC DEVICE AND COATING SOLUTIONS SUITABLE FOR THE PRODUCTION METHOD

(75) Inventor: Toru Yumoto, Fuji (JP)

(73) Assignee: Asahi Kasei Kabushiki Kaisha, Osaka-Shi, Osaka (JP)

( * ) Notice: Subject to any disclaimer, the term of this patent is extended or adjusted under 35 U.S.C. 154(b) by 1089 days.

(21) Appl. No.: 11/987,565

(22) Filed: Nov. 30, 2007

(65) Prior Publication Data

US 2008/0145520 A1 Jun. 19, 2008

(30) Foreign Application Priority Data

| Dec. 4, 2006 | (JP) | 2006-327096 |
| Dec. 4, 2006 | (JP) | 2006-327097 |
| Jun. 18, 2007 | (JP) | 2007-160289 |
| Jun. 18, 2007 | (JP) | 2007-160290 |

(51) Int. Cl.
*B05D 5/12* (2006.01)

(52) U.S. Cl. .......................................... 427/66

(58) Field of Classification Search .................. 427/66
See application file for complete search history.

(56) References Cited

U.S. PATENT DOCUMENTS

| 4,125,414 | A | 11/1978 | Tang et al. |
| 4,281,053 | A | 7/1981 | Tang |
| 6,274,412 | B1 * | 8/2001 | Kydd et al. ................ 438/149 |
| 7,012,364 | B2 | 3/2006 | Mori et al. |
| 7,378,679 | B2 | 5/2008 | Toyoda |
| 2001/0019242 | A1 * | 9/2001 | Tada et al. ................... 313/504 |
| 2003/0148024 | A1 * | 8/2003 | Kodas et al. ................. 427/125 |
| 2004/0102577 | A1 * | 5/2004 | Hsu et al. .................... 525/182 |
| 2006/0063029 | A1 * | 3/2006 | Jang et al. .................... 428/690 |
| 2006/0202616 | A1 * | 9/2006 | Gong et al. .................. 313/506 |
| 2008/0197768 | A1 | 8/2008 | Conway et al. |
| 2009/0152531 | A1 | 6/2009 | Towns et al. |

FOREIGN PATENT DOCUMENTS

| JP | 2000-77185 A | 3/2000 |
| JP | 2004-335180 A | 11/2004 |
| JP | 2006-172854 A1 | 6/2006 |

(Continued)

OTHER PUBLICATIONS

Office Action dated Jan. 11, 2011 for Japanese Patent Application No. 2007-312387.

(Continued)

*Primary Examiner* — Joseph Del Sole
*Assistant Examiner* — Kimberly A Stewart
(74) *Attorney, Agent, or Firm* — Birch, Stewart, Kolasch & Birch, LLP

(57) ABSTRACT

It is intended to provide a method for producing an electronic device having a multilayer structure by a coating method, and a coating solution suitable for the production method. The present invention provides a method for producing an electronic device having at least two or more stacked layers containing organic matter, comprising a first step of applying a coating solution containing organic matter and a metal and/or a metal oxide onto a substrate either directly or via an additional layer to form a mixed layer, and a second step of directly applying a solution containing organic matter onto the mixed layer formed in the first step to form an organic layer. According to this method, an electronic device having a multilayer structure can be produced easily by a convenient coating method.

1 Claim, 7 Drawing Sheets

FOREIGN PATENT DOCUMENTS

| | | |
|---|---|---|
| JP | 2008-516040 A | 5/2008 |
| WO | WO 2006/040530 A1 | 4/2006 |

OTHER PUBLICATIONS

Office Action dated Oct. 5, 2010 for Japanese Patent Application No. 2007-312387.

C.W. Tang, et al., Appl. Pys. Lett., 51 pp. 913-915 (1987) "Organic electroluminescent diodes".

"Organic Electroluminescence Handbook" Realize Science and Engineering, p. 260, (2004).

* cited by examiner

METHOD FOR PRODUCING ELECTRONIC DEVICE AND COATING SOLUTIONS SUITABLE FOR THE PRODUCTION METHOD

BACKGROUND OF THE INVENTION

1. Field of the Invention

The present invention relates to a method for producing an electronic device such as an organic electroluminescent device (hereinafter, appropriately referred to as an "organic light-emitting diode (OLED)"), which is a self-luminous device used as an organic thin-film solar cell, a transistor device, a display device for displays, and a device for lightings, and to a coating solution suitable for the production method.

2. Description of the Related Art

Methods for producing an electronic device using various coating methods have been studied actively for achieving cost reduction, larger area devices, and flexibility. However, the requirement for using the coating methods is that a primary coating is insoluble in a solvent applied thereon.

For example, to produce a transistor device, a protective film is stacked by a coating method after the application of an organic semiconductor layer. In this case, the primary coating film (organic semiconductor layer) must be prevented from being dissolved in a solvent applied thereon.

Alternatively, to produce an organic thin-film solar cell, different or the same organic semiconductor materials are stacked. For example, p-type and n-type organic semiconductors are stacked by a coating method, or a mixed layer of p-type and n-type organic semiconductors is introduced into p-n junction. In such a case, the primary coating film must be prevented from being dissolved in a solvent applied thereon, or the interface between the layers must be controlled.

Next, an organic light-emitting diode (OLED) will be described as a specific example.

Research and development have been conducted actively on organic light-emitting diodes (OLED) since the report by Tang and VanSlyke (Non-Patent Document 1). In general, the organic light-emitting diodes (OLED) are divided into two groups, low-molecular-weight and high-molecular-weight organic matters. A film of the low-molecular-weight organic matter is generally formed by a method using vacuum vapor deposition. The use of the vacuum vapor deposition can easily prepare a multilayer structure of organic layers having independent functions and can produce a high-performance organic light-emitting diode (OLED). Recently, low-molecular-weight organic matter that exhibits excellent performance in an organic light-emitting diode (OLED) has been synthesized and has reached a practical level. However, the vapor deposition method performs film formation in a vacuum. Therefore, it is difficult to achieve larger area devices, and material utilization efficiency is insufficient.

By contrast, the high-molecular-weight organic matter can be produced by a method using various coating methods. Examples of the various coating methods include casting, spin-coating, ink jet, dipping, spraying, and printing methods. These coating methods can perform film formation at atmospheric pressure and easily achieve larger area devices as compared with the vapor deposition method. Moreover, material utilization efficiency is also high. Therefore, these methods are advantageous in terms of cost.

However, performance improvement using a multilayer structure requires selecting a solvent that does not dissolve therein the organic layer as a primary coating as a solvent for a coating solution applied later. Thus, it was difficult to prepare a multilayer structure due to constraints such as the limited selection of materials that can be used.

A known technique for stacking layers of organic matter involves performing insolubilization treatment using crosslinking (see e.g., Patent Document 1). However, this technique has constraints such as possible complicated production steps and a need to introduce a crosslinking group.

Alternatively, a technique often used involves stacking layers by a coating method using PEDOT/PSS, which is high-molecular-weight organic matter used in a water dispersion system, as a hole injection material and using high-molecular-weight organic matter as a luminescent layer material. However, this method is based on a water system, and a variety of ionic impurities might possibly influence the reliability of the organic light-emitting diode (OLED). Moreover, according to a report, the diffusion of an S or $SO_3$ group from PEDOT reduces luminescence efficiency (Non-Patent Document 2).

In recent years, study has been made to apply low-molecular-weight organic matter to a coating method. In the formation of a multilayer structure, an organic layer of low-molecular-weight organic matter as a primary coating, as with high-molecular-weight organic matter, is soluble in a solvent for a coating solution applied later. Thus, it was difficult to prepare a multilayer structure.

[Patent Document 1] JP2000-077185A
[Non-Patent Document 1] C. W. Tang and S. A. VanSlyke: Appl. Phys. Lett., 51, p. 913 (1987)
[Non-Patent Document 2] "Organic EL Handbook", published by Realize Science & Engineering Center Co., Ltd. 2004, p. 260

An object of the present invention is to provide a method for producing an electronic device, which is effective for every organic matter including low-molecular-weight and high-molecular-weight organic matters and is capable of forming a multilayer structure by a coating method using the organic matter, and a coating solution suitable for the production method. For example, an object of the present invention is to provide a method for producing an organic light-emitting diode (OLED) and a coating solution suitable for the production method.

SUMMARY OF THE INVENTION

The present inventor has conducted diligent studies for solving the problems described above and has consequently completed the present invention. The feature of the present invention is to impart organic solvent resistance to a stacked layer.

Specifically, according to a 1st aspect, the present invention provides a method for producing an electronic device having at least two or more stacked layers containing organic matter, comprising forming a first layer (mixed layer) using a coating solution A containing organic matter and a metal and/or a metal oxide, and then stacking a second layer thereon using a coating solution B containing organic matter.

According to a 2nd aspect, the present invention provides the method for producing an electronic device according to the 1st aspect, the electronic device having at least two or more stacked layers containing organic matter between a pair of electrodes, the method comprising a first step of applying the coating solution A containing organic matter and a metal and/or a metal oxide onto one of the pair of electrodes either directly or via an additional layer to form a first layer (mixed layer), and a second step of directly applying the coating solution B containing organic matter onto the mixed layer formed in the first step to form an organic layer as a second layer.

According to a 3rd aspect, the present invention provides the method for producing an electronic device according to the 2nd aspect, wherein at least one of the pair of electrodes is an ITO electrode, the method comprising a first step of directly applying the coating solution A containing organic matter and a metal and/or a metal oxide onto the ITO electrode to form a first layer (mixed layer), and a second step of directly applying the coating solution B containing organic matter onto the mixed layer formed in the first step to form an organic layer as a second layer.

According to a 4th aspect, the present invention provides the method for producing an electronic device according to any one of the 1st to 3rd aspects, wherein the organic matter is an organic semiconductor.

According to a 5th aspect, the present invention provides the method for producing an electronic device according to the 4th aspect, wherein the organic semiconductor contained in the coating solution A is any one selected from hole injection materials, hole transport materials, and hole injection/transport materials.

According to a 6th aspect, the present invention provides the method for producing an electronic device according to the 4th aspect, wherein the organic semiconductor contained in the coating solution A is any one selected from electron injection materials, electron transport materials, and electron injection/transport materials.

According to a 7th aspect, the present invention provides the method for producing an electronic device according to the 4th aspect, wherein the organic semiconductor contained in the coating solution A is a hole/electron transport material.

According to an 8th aspect, the present invention provides the method for producing an electronic device according to any one of the 1st to 7th aspects, wherein the metal contained in the coating solution A is any one or more of indium, tin, zinc, and titanium.

According to a 9th aspect, the present invention provides the method for producing an electronic device according to the 8th aspect, wherein the metal contained in the coating solution A is any one or more of indium and tin.

According to a 10th aspect, the present invention provides the method for producing an electronic device according to any one of the 1st to 7th aspect, wherein the metal oxide contained in the coating solution A is any one of indium oxides, tin oxides, indium-tin oxides, zinc oxides, indium-zinc oxides, titanium oxides, and oxides derived from adding metal to any of these oxides.

According to an 11th aspect, the present invention provides the method for producing an electronic device according to the 10th aspect, wherein the metal oxide contained in the coating solution A is any one of indium oxides, tin oxides, and indium-tin oxides.

According to a 12th aspect, the present invention provides the method for producing an electronic device according to any one of the 1st to 11th aspects, wherein the organic matter contained in the coating solution B is a luminescent material.

According to a 13th aspect, the present invention provides the method for producing an electronic device according to any one of the 1st to 12th aspects, wherein solvents used in the coating solutions A and B are organic solvents.

According to a 14th aspect, the present invention provides the method for producing an electronic device according to any one of the 1st to 13th aspects, wherein the electronic device is an organic electroluminescent device.

According to a 15th aspect, the present invention provides the method for producing an electronic device according to any one of the 1st to 13th aspects, wherein the electronic device is an organic thin-film solar cell.

On the other hand, according to a 16th aspect, the present invention provides
a coating solution suitable for forming one layer containing organic matter for an electronic device, the coating solution containing organic matter and a metal and/or a metal oxide, wherein the organic matter is made of an organic semiconductor material, and the content of the organic matter is between 20 wt % and 80 wt %, both inclusive, with respect to a solid matter weight except for a solvent.

According to a 17th aspect, the present invention provides
a coating solution suitable for forming one layer containing organic matter for an electronic device, the coating solution containing organic matter and a metal and/or a metal oxide, wherein the organic matter is made of a hole injection or hole transport material or a hole injection/transport material having the functions of both of these materials, and the content of the organic matter is between 20 wt % and 80 wt %, both inclusive, with respect to a solid matter weight except for a solvent.

According to an 18th aspect, the present invention provides
a coating solution suitable for forming one layer containing organic matter for an electronic device, the coating solution containing organic matter and a metal and/or a metal oxide, wherein the organic matter is made of an electron injection or electron transport material or an electron injection/transport material having the functions of both of these materials, and the content of the organic matter is between 20 wt % and 80 wt %, both inclusive, with respect to a solid matter weight except for a solvent.

According to a 19th aspect, the present invention provides
a coating solution suitable for forming one layer containing organic matter for an electronic device, the coating solution containing organic matter and a metal and/or a metal oxide, wherein the organic matter is made of a material having the functions of both of hole transport and electron transport materials or a mixture of both of these materials, and the content of the organic matter is between 20 wt % and 80 wt %, both inclusive, with respect to a solid matter weight except for a solvent.

According to a 20th aspect, the present invention provides
the coating solution according to any one of the 16th to 19th aspects, wherein the electronic device is an organic electroluminescent device.

According to a 21st aspect, the present invention provides
the coating solution according to any one of the 16th to 19th aspects, wherein the electronic device is an organic thin-film solar cell.

According to a 22nd aspect, the present invention provides
the coating solution according to any one of the 16th to 21st aspects, wherein the organic matter is low-molecular-weight organic matter.

According to a 23rd aspect, the present invention provides
the coating solution according to any one of the 16th to 22nd aspects, wherein
the metal of the metal and/or the metal oxide comprises at least any one of indium, tin, zinc, and titanium, and
the metal oxide of the metal and/or the metal oxide comprises at least any one of indium oxides, tin oxides, indium-tin oxides, zinc oxides, indium-zinc oxides, titanium oxides, and metal-doped oxides derived from any of these metal oxides.

According to a 24th aspect, the present invention provides
the coating solution according to any one of the 16th to 22nd aspects, wherein the metal of the metal and/or the metal oxide comprises at least any one of indium and tin, and the metal oxide of the metal and/or the metal oxide comprises at least any one of indium oxides, tin oxides, and indium-tin oxides, and oxides derived from adding metal to any of these metal oxides.

According to a 25th aspect, the present invention provides a method for producing an organic electroluminescent device, in which at least two layers containing an organic matter are stacked between a pair of electrodes, at least one of which is indium-tin oxide (ITO), the method comprising:

coating a coating solution A directly on one electrode of the ITO so as to produce a first layer, wherein the coating solution A includes:

an organic solvent;

an organic matter having one selected from a hole injection material, a hole transport material, a hole injection/transport material, an electron injection materials, an electron transport materials, and an electron injection/transport materials; and an inorganic matter having at least one selected from Sn, In, tin oxide, indium oxide, and ITO, and coating directly on the first layer a solution B that includes a luminescent material and an organic solvent, so as to produce a second layer.

The method for producing an electronic device according to the present invention can prepare a multilayer structure easily and reliably by using a coating solution containing organic matter and a metal and/or a metal oxide. Thus, an electronic device having a multilayer structure can be produced easily by a convenient coating method.

Moreover, the use of the coating solution of the present invention can prepare a multilayer structure easily and reliably. A mixed layer made of the organic and inorganic matters can be prepared by a coating method. Therefore, the coating solution of the present invention offers a lot of flexibility in the selection of materials, easy production, and larger area devices. The coating solution is particularly useful for an organic light-emitting diode (OLED) and an organic thin-film solar cell, particularly, organic light-emitting diode (OLED).

DETAILED DESCRIPTION OF THE PREFERRED EMBODIMENTS

Figure 1:
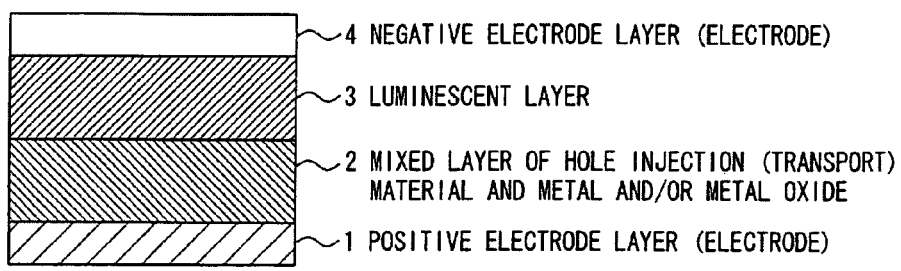
FIG. 1 is a structure diagram showing one embodiment of an organic light-emitting diode (OLED) of the present invention.

Hereinafter, the preferred embodiments of the present invention will be described in detail.

A method for producing an electronic device according to the present invention comprises a first step of applying a coating solution containing organic matter and a metal and/or a metal oxide to form a mixed layer, and a second step of directly applying a coating solution containing organic matter onto the mixed layer formed in the first step to form a layer.

In this context, the electronic device described in the present invention refers to, for example, an organic light-emitting diode (OLED), a transistor device, and an organic thin-film solar cell.

First, the coating solution used for forming a mixed layer at the first step contains organic matter and a metal and/or a metal oxide and also contains a solvent. A solid matter concentration thereof is, preferably, from 0.01 wt % to 40 wt % or lower. Alternatively, the solid matter concentration is, preferably, from 0.1 wt % to 10 wt % or lower from the viewpoint of storage stability of the solution and is, more preferably, from 0.1 wt % to 3.0 wt % or lower for obtaining an appropriate film thickness.

Examples of the metal oxide used in this coating solution included zinc oxides (ZnO), tin oxides ($SnO_2$), indium oxides ($In_2O_3$), and titanium oxides ($TiO_2$). These metal oxides are usually observed to have a so-called lattice defect in which the crystal lattice is defective in places. Specifically, the metal oxide is produced in an oxygen-deficient state, which produces a redundant electron, and thereby exhibits photo-semiconductive properties. Vacancy formation may be promoted actively by reduction firing with a reduced oxygen supply during production or by the addition of a certain dopant.

The dopant used is aluminum (Al) or gallium (Ga) for zinc oxides, antimony (Sb) (or antimony oxide) for tin oxides, and niobium (Nb) for titanium oxides. Alternatively, the dopant used is tin (Sn) (tin oxide) for indium oxides. This is called indium-tin oxide (ITO) and is often used as an electrode in an organic light-emitting diode (OLED). The metal oxide is, preferably, ITO from the viewpoint of adhesiveness to an electrode. Alternatively, IZO (indium-zinc oxide) that is transparent and highly conductive is also preferable. When IZO is used as an electrode (positive electrode) in organic light-emitting diode (OLED), the metal oxide of the present invention is, preferably, IZO from the viewpoint of adhesiveness. It is important that an inorganic matter constituting an electrode be included in a mixed layer, in order to enhance adhesiveness between the mixed layer and the electrode, and that the inorganic matter be an oxide, so as to increase transparency. For example, preferably an ITO electrode is a mixed layer that includes an ITO.

Metal oxides such as metal-doped oxides derived from indium-tin oxides, indium-zinc oxides, or titanium oxides, from zinc oxides, or from tin oxides are preferable because they can form a transparent film.

One example of a general method for preparing ITO particles will be described specifically. However, the present invention is not limited to the example below.

Indium and tin salts are dissolved in an organic solvent. Then, this solution is stirred at a temperature of 10° C. to 80° C., while an alkali solution is added thereto. The obtained mixture of indium and tin hydroxides can be dried and heat-treated to prepare ITO particles.

Alternatively, particles can be prepared by a sol-gel method, depending on metal oxide types.

The metal oxide surface is chemically modified to thereby enhance interaction with a hole transport or electron transport material. Alternatively, the metal oxide surface is chemically modified and provided with a chemical bond with a hole transport or electron transport material to thereby further improve adhesiveness and solvent resistance. For example, a variety of coupling agents can be added thereto to thereby enhance the interaction.

The use of the metal oxide improves adhesiveness to an electrode and is therefore effective for a flexible organic transistor, a flexible organic light-emitting diode (OLED), and a flexible organic thin-film solar cell, which require flexibility.

Examples of the metal used in this coating solution include zinc, tin, titanium, and indium. These metals are preferable because they can be oxidized after film preparation and made into oxides. Among them, indium is preferably used. Indium and tin, when used in combination, can be made into indium-tin oxides after film preparation. Therefore, in the present invention, it is more preferable to use indium and tin.

The organic matter used in this coating solution may be any of high-molecular-weight and low-molecular-weight organic matters. It is particularly preferable to use low-molecular-weight organic matter having a molecular weight of 2000 or smaller. Organic semiconductor materials used in an organic thin-film solar cell, an organic transistor, and an organic light-emitting diode (OLED) are further preferable. These materials encompass materials capable of hole transport (hole injection materials, hole transport materials, and hole injection/transport materials), materials capable of electron transport (electron injection materials, electron transport materials, and electron injection/transport materials), and hole/electron transport materials having the functions of both of the hole transport and electron transport materials.

The materials capable of hole transport are not particularly limited and are, preferably, selected from among hole injection materials, hole transport materials, and hole injection/transport materials particularly used in an organic light-emitting diode (OLED), from the viewpoint of an appropriate ionization potential and favorable hole mobility, which are important for driving an organic light-emitting diode (OLED). Specific materials will be listed below. However, the present invention is not limited to the examples below. Every material having the function can be used. Alternatively, the materials described below may be mixed in combination of two or more of them.

Examples of the hole injection or hole transport material or the hole injection/transport material having the functions of both of these materials include aromatic amine-based materials such as N,N'-diphenyl-N,N'-bis(1-naphthyl)-1,1'-biphenyl-4,4'-diamine (NPD), N,N'-diphenyl-N,N'-bis(3-methylphenyl)-1,1'-biphenyl-4,4'-diamine (TPD), 1,3,5-tris(3-methyldiphenylamino)benzene (m-MTDATA), 2,7-bis[1-naphthyl(phenyl)amino]-9,9'-spirobifluorene (spiro-NPB), 2,2',7,7'-diphenylamino-spiro-9,9'-bifluorene (spiro-TAD), 4,4',4''-tri(N-carbazole)triphenylamine (TCTA), 4,4',4''-tris[1-naphthyl(phenyl)amino]triphenylamine (1-TNATA), and 4,4',4''-tris[2-naphthyl(phenyl)amino]triphenylamine (2-TNATA). Additional examples thereof include phthalocyanine-based complexes such as copper phthalocyanine (CuPc) and zinc phthalocyanine (ZnPc), aniline-based copolymers, porphyrin-based compounds, imidazole derivatives, triazole derivatives, pyrazoline derivatives, oxazole derivatives, oxadiazole derivatives, stilbene derivatives, polyarylalkane derivatives, and acene-based compounds such as anthracene, tetracene, pentacene, and hexacene. Alternative examples thereof include derivatives of these acene-based compounds, that is, derivatives of the acene-based compounds comprising a substituent such as alkyl, alkoxy, halogen, ketone, ester, ether, amino, hydroxy, benzyl, benzoyl, phenyl, and naphthyl groups introduced therein, and quinone derivatives of the acene-based compounds. Specific examples of these derivatives include 6,13-bis(triisopropylsilylethynyl) pentacene.

Alternative examples of these materials also include high-molecular-weight hole injection or hole transport materials such as polyaniline, polyvinylanthracene, polycarbazole, poly(N-vinylcarbazole) (PVK), polyfluorene, poly(ethylenedioxy)thiophene/poly(styrenesulfonic acid) (PEDOT/PSS), thiophene-fluorene copolymers, phenyleneethynylene-thiophene copolymers, polyalkylthiophene, poly(p-phenylenevinylene), and other thiophene-based compounds.

These materials may be used as organic semiconductor materials for an organic transistor, depending on mobility.

Some of these materials may be used as p-type organic semiconductor materials for an organic thin-film solar cell.

Subsequently, the materials capable of electron transport will be described.

The materials capable of electron transport are not particularly limited and are, preferably, selected from among electron injection materials, electron transport materials, and electron injection/transport materials particularly used in an organic light-emitting diode (OLED), from the viewpoint of favorable electron mobility and appropriate HOMO (Highest Occupied Molecular Orbital) and LUMO (Lowest Unoccupied Molecular Orbital), which are important for driving an organic light-emitting diode (OLED). Specific materials will be listed below. However, the present invention is not limited to the examples below. Every material having the function can be used. Alternatively, the materials described below may be mixed in combination of two or more of them. The electron injection materials, the electron transport materials, and the electron injection/transport materials also encompass hole-blocking materials.

Examples of the electron injection or electron transport material or the electron injection/transport material having the functions of both of these materials include tris(8-hydroxyquinolinolato)aluminum complexes ($Alq_3$), tris(4-methyl-8-quinolinolato)aluminum ($Almq_3$), bis(2-methyl-8-quinolinolato)(p-phenylphenolato)aluminum (III) (BAlq), bis(benzoquinolinolato)beryllium complexes ($BeBq_2$), and derivatives of these complexes. Alternatively, 2-(4-biphenylyl)-5-(4-tert-butylphenyl)-1,3,4-oxadiazole (PBD), other oxadiazole derivatives, 3-(4-tert-butylphenyl)-4-phenyl-5-(4-biphenylyl)-1,2,4-triazole (TAZ), other triazole derivatives, bathophenanthroline (Bphen), and bathocuproine (BCP) can be used. Alternative examples thereof include fullerene derivatives such as $C_{60}$ and $C_{70}$ derivatives, and perylene derivatives. Further alternative examples thereof include polyphenylenevinylene, polyfluorene, and their derivatives and their copolymers.

These materials may be used as organic semiconductor materials for an organic transistor, depending on mobility.

Some of these materials may be used as n-type organic semiconductor materials for an organic thin-film solar cell.

Examples of the hole/electron transport material having the functions of both of the hole transport and electron transport materials include 4,4'-bis(9-carbazole)biphenyl (CBP) and 2,7-di-9-carbazolyl-9,9'-spirobifluorene (spiro-CBP). Alternatively, the hole transport and electron transport materials listed above can be used in combination as a mixture of the hole transport and electron transport materials.

The low-molecular-weight organic matter can easily be rendered highly pure. Layers of a multilayer structure combination (e.g., a hole transport layer and a luminescent layer) with proved performance in a vapor deposition method can be stacked by the production method of the present invention or by combining of the production method of the present invention and a vapor deposition method to thereby obtain an organic light-emitting diode (OLED) or organic thin-film solar cell having excellent performance. A crystallization problem attributed to low Tg (glass transition temperature), a disadvantage of the low-molecular-weight organic matter, can also be suppressed by using the present technique. In this context, the low-molecular-weight organic matter described in the present invention refers to organic matter having a molecular weight of 2000 or smaller, and the high-molecular-weight organic matter described in the present invention refers to organic matter having a molecular weight exceeding 2000.

The content of the organic matter contained in the coating solution of the present invention is preferably 20 wt % or more with respect to a solid matter weight except for a solvent in light of appropriate hole transport and hole injection properties and is preferably 80 wt % or less from the viewpoint of solvent resistance, the preparation of an uniform thin film, and the prevention of crystallization. The content is, more preferably, between 30 wt % and 70 wt %, both inclusive.

The content of the organic matter contained in the coating solution of the present invention is preferably 20 wt % or more with respect to a solid matter weight except for a solvent in light of appropriate electron transport and electron injection properties and is preferably 80 wt % or less from the viewpoint of solvent resistance, the preparation of an uniform thin film, and the prevention of crystallization. The content is, more preferably, between 30 wt % and 70 wt %, both inclusive.

The mixing ratio of the organic and inorganic matters in the mixed layer prepared from the coating solution of the present invention is, preferably, a weight ratio of the organic matter: inorganic matter=1:30 or more from the viewpoint of the functions (hole transport properties, electron transport properties, and an appropriate ionization potential) of the organic matter and is, preferably, a weight ratio of the organic matter: inorganic matter=30:5 or less from the viewpoint of solvent resistance, the preparation of an uniform thin film, and the prevention of crystallization. The mixing ratio is, preferably, a weight ratio of the organic matter:inorganic matter=1:4 or more from the viewpoint of the functions (hole transport properties, electron transport properties, and an appropriate ionization potential) of the organic matter and is, preferably, a weight ratio of the organic matter:inorganic matter=4:1 or less from the viewpoint of solvent resistance, the preparation of an uniform thin film, and the prevention of crystallization. The mixing ratio is, more preferably, between 1:3 and 3:1, both inclusive.

A solvent for the coating solution of the present invention may be selected appropriately according to the types of the metal and/or the metal oxide used and the organic matter used. Examples thereof include: water; alcohols such as methanol, ethanol, propanol, butanol, and hexanol; glycols such as ethylene glycol and propylene glycol; ketones such as acetone and methyl ethyl ketone; esters such as ethyl acetate and butyl acetate; ethers such as dioxane and tetrahydrofuran; amides such as N,N-dimethylformamide; and hydrocarbons such as benzene, toluene, xylene, trimethylbenzene, hexane, heptane, octane, nonane, decane, cyclohexane, decahydronaphthalene (decalin), and tetralin. It is particularly preferable to use solvents other than water for reducing the influence of ionic impurities.

The coating solution of the present invention may be supplemented with an additive such as a surfactant for the purpose of improving dispersion stability. The amount of the additive added may be 0.0001 wt % to 10 wt % with respect to the solid matter weight of the organic matter from the viewpoint of the balance between improvement in dispersion stability and reduction in hole transport ability. The surfactant is not particularly limited. For example, anionic, nonionic, cationic, zwitterionic, and polymeric surfactants can be used.

Examples of the surfactant include: anionic surfactants such as fatty acid salts (e.g., sodium lauryl sulfate), fatty alcohol sulfate, alkylbenzene sulfonate (e.g., sodium dodecylbenzenesulfonate), polyoxyethylene alkyl ether sulfate, polyoxyethylene polycyclic phenyl ether sulfate, polyoxynonylphenyl ether sulfonate, polyoxyethylene-polyoxypropylene glycol ether sulfate, and so-called reactive surfactants having a sulfonic acid or sulfuric ester group and a polymerizable unsaturated double bond in the molecules; nonionic surfactants such as polyoxyethylene alkyl ether, polyoxyethylene nonylphenyl ether, sorbitan fatty acid ester, polyoxyethylene fatty acid ester, polyoxyethylene-polyoxypropylene block copolymers, and reactive nonionic surfactants having the skeleton and a polymerizable unsaturated double bond in the molecules; cationic surfactants such as alkyl amine salts and quaternary ammonium salts; and (denatured) polyvinyl alcohol.

The coating solution containing the organic and inorganic matters may also be supplemented with an organic metal compound as a dispersant.

Next, the method for producing an electronic device using such a coating solution will be described in detail.

Conventional approaches for preparing a multilayer structure by a coating method involved selecting a solvent that does not dissolve therein an organic layer as a primary coating, dissolving, in the solvent, organic matter used in a top coating layer, and forming a multilayer structure, or involved subjecting an organic layer as a primary coating to some treatment for preventing the organic layer from being dissolved in a solvent for a top coating, and forming an upper layer thereon using the organic matter dissolved in the solvent.

However, these methods presented problems such as the limited selection of solvents, complicated production steps, and a need to introduce a particular functional group into a primary coating.

The present inventor has conducted diligent studies for solving the problems and has consequently achieved the production of an electronic device having a multilayer structure by a coating method by using, as a primary coating layer, a layer formed from a coating solution containing organic matter and a metal and/or a metal oxide. Specifically, the present inventor has successfully imparted organic solvent resistance to a film by preparing the film using a coating solution containing organic matter and a metal and/or a metal oxide.

A transistor device, an organic thin-film solar cell, and an organic light-emitting diode (OLED) will be described as specific examples.

First, a transistor element, specifically, an organic transistor device will be described.

Study has been made on many various structures of the organic transistor device. For example, in a bottom-gate structure, a protective layer is provided on an organic semiconductor layer. Examples of organic semiconductor materials include materials such as acene-based compounds (e.g., pentacene), phthalocyanine-based compounds, fluorene-bithiophene copolymers, and polyhexylthiophene. Alternative examples thereof include the hole injection and hole transport materials described above. Examples of the protective layer include polyvinyl alcohol, acrylic resins, polyimide, silicon nitride, and polysilazane-based resins. In addition, materials having high barrier properties can be used to prepare a multilayer structure. In such a structure, a film is prepared using a coating solution containing an organic semiconductor material and a metal and/or a metal oxide. As a result, a film having solvent resistance can be prepared. Therefore, the protective layer can be stacked thereon by a coating method. Alternatively, an electrode is sometimes provided on the organic semiconductor layer. Examples of the electrode include thiophene-based materials such as PEDOT/PSS, and a variety of metal materials. In such a structure, a film is prepared using a coating solution containing an organic semiconductor material and a metal and/or a metal oxide. As a result, a film having solvent resistance can be prepared. Therefore, the electrode can be stacked thereon by a coating method.

Alternatively, in a top-gate structure, a gate insulating film is provided on an organic semiconductor layer. Materials for the gate insulating film encompass almost all polymers exhibiting insulating characteristics. Examples thereof include polycarbonate, polyvinylphenol, polyimide, polymethylmethacrylate, polysiloxane, butadiene-based polymers, and polysilazane-based resins and additionally include acrylic resins, epoxy resins, melamine resins, phenol resins, and urea resins. In such a structure, a film is prepared using a coating solution containing an organic semiconductor material and a metal and/or a metal oxide. As a result, a film having solvent resistance can be prepared. Therefore, the gate insulating film can be stacked thereon by a coating method.

Next, an organic thin-film solar cell will be described.

A general organic thin-film solar cell has a structure in which, for example, a transparent substrate, a transparent electrode, an organic semiconductor layer made of a material capable of hole transport and/or a material capable of electron transport, and a metal electrode layer are stacked in order. Alternatively, plural layers of organic semiconductor materials are sometimes stacked as organic semiconductor layers. Such organic semiconductor layers may be two or more stacked organic layers selected from the group consisting of a hole/electron transport layer comprising p-type and n-type organic semiconductor materials, a hole transport layer comprising a p-type organic semiconductor material, and an electron transport layer comprising an n-type organic semiconductor material. In such a case, a film is prepared using the coating solution containing an organic semiconductor material and a metal and/or a metal oxide according to the present invention. As a result, films can be stacked by a coating method. For example, when the electron transport layer is stacked on the hole transport layer, a film is prepared using a coating solution containing a hole transport material and a metal and/or a metal oxide. As a result, a film having solvent resistance can be prepared. Therefore, the electron transport layer can be stacked thereon by a coating method.

Next, an organic light-emitting diode (OLED) will be described.

In the method for producing an organic light-emitting diode (OLED) according to the present invention, a coating solution containing organic matter and a metal and/or a metal oxide is applied onto one of electrodes either directly or via an additional layer to form a mixed layer at a first step of the present invention.

The coating solution can be prepared by mixing the organic matter and the metal and/or the metal oxide, the solvent, and the optionally added additive. The organic matter is dissolved in the solvent in advance, and then, a solution containing the metal and/or the metal oxide may be added dropwise gradually and mixed therewith.

A method for mixing or dispersing the solution is not particularly limited. For example, a bead mill, a homogenizer, or ultrasonication can be used in combination or alone.

The concentration of the coating solution can be changed according to the thickness of a film to be prepared. However, the concentration is, preferably, set to 40 wt % or lower, more preferably 20 wt % or lower, from the viewpoint of the stability of the coating solution. Moreover, it is more preferable that the concentration is less than 10 wt % or lower.

The viscosity of the coating solution can be adjusted with the organic solvent and the surfactant. The viscosity can be adjusted appropriately to favorable viscosity according to a coating method.

A casting, spin coating, ink jet, dipping, spraying, or printing method can be used as a coating method.

It is preferred that the mixed layer prepared from this coating solution should be transparent for permitting light emitted from a luminescent layer to pass therethrough. In this context, the term "transparent" refers to a light transmittance of 80% or higher at a light wavelength of 450 nm to 600 nm.

It is preferred that after the formation of the layer prepared from this coating solution, the oxidation of the metal should be promoted by heating to form a transparent film made of the inorganic and organic matters. A specific temperature for the heating is preferably 100° C. or higher from the viewpoint of the oxidation of the metal and the removal of the solvent and is more preferably 150° C. or higher, even more preferably, between 200° C. and 300° C., both inclusive.

The film thickness of the mixed layer prepared from the coating solution at the first step in the present invention is preferably 200 nm or smaller from the viewpoint of hole transport or electron transport properties and is more preferably 150 nm or smaller.

When the mixed layer prepared from this coating solution is formed on an electrode, adhesiveness to the electrode as a primary coating can be improved. The improvement in adhesiveness can be expected to improve device stability.

When the mixed layer prepared from this coating solution is used as a hole transport, hole injection, or hole injection/transport layer, an ionization potential can be adjusted appropriately according to the organic matter mixed therein. A barrier to hole injection from the electrode to the upper layer (e.g., a luminescent layer) can be reduced.

Alternatively, when the mixed layer prepared from this coating solution is used as an electron transport, electron injection, or electron injection/transport layer, HOMO and LUMO can be adjusted according the organic matter mixed therein. A barrier to electron injection from the electrode to the upper layer (e.g., a luminescent layer) can be reduced, or a hole can be blocked.

Furthermore, the crystallization or aggregation of the organic matter can be reduced by mixing the metal and/or the metal oxide therewith. Moreover, heat resistance can be improved.

The mixed layer prepared from this coating solution can be prevented from being dissolved in an organic solvent. Therefore, on this mixed layer, organic matter having a different function can be prepared by coating. Particularly, it was conventionally difficult to stack low-molecular-weight organic matter by coating. However, the use of the present technique can allow the use of low-molecular-weight organic matter having appropriate HOMO and LUMO and is therefore effective.

Moreover, the coating solution can be prepared as a non-aqueous system. Therefore, the influence of ionic impurities can be reduced. Furthermore, the selection of materials without the use of an S or $SO_3$ group, which is a problem in PEDOT/PSS, can be achieved by selecting low-molecular-weight organic matter. Accordingly, an organic light-emitting diode (OLED) having an improved lifetime and luminescence efficiency can be expected.

Next, a coating solution containing organic matter is applied onto the mixed layer prepared from this coating solution containing organic matter and a metal and/or a metal oxide to form an organic layer such as a luminescent layer at a second step of the method of the present invention. The organic matter used in this layer may be any of low-molecular-weight and high-molecular-weight organic matters. The organic matter is dissolved or dispersed in a particular organic solvent to prepare a solution (coating solution). This coating solution may be supplemented with an additive such as a dispersant.

Alternatively, a luminescent layer may be formed using the present technique. For example, when an electron transport layer is stacked on the luminescent layer, a film is prepared using a coating solution containing a luminescent material and a metal and/or a metal oxide. As a result, a film having solvent resistance can be prepared. Therefore, the electron transport layer can be stacked thereon by a coating method.

The concentration of the coating solution used at the second step can be changed according to the thickness of a film to be prepared. However, the concentration is, preferably, set to 40 wt % or lower from the viewpoint of the stability of the coating solution.

The viscosity of the coating solution used at the second step can be adjusted with the organic solvent and the additive. The viscosity can be adjusted appropriately to favorable viscosity according to a coating method.

A casting, spin coating, ink jet, dipping, spraying, or printing method can be used as a coating method. After coating, the obtained film may be dried, if necessary.

The film thickness of the organic layer prepared at the second step in the present invention is preferably 200 nm or smaller from the viewpoint of a driving voltage.

The organic layer prepared at the second step and the mixed layer prepared at the first step do not have to be clearly independent in the structure and may be in a state in which the components at the first and second steps are mixed. For example, a mixed layer A is formed in the first step on an electrode, and an organic layer B is formed thereon. In this case, in a possible structure, the composition of the mixed layer A accounts for several nm (or several tens of nm) in proximity to the electrode; the composition of the mixed layer A mixed with the organic layer B accounts for several tens of nm therefrom; and the organic layer B accounts for several nm (or several tens of nm) therefrom. In another possible structure, the composition of the mixed layer A accounts for several nm (or several tens of nm) in proximity to the electrode; and the composition of the mixed layer A mixed with the organic layer B accounts for several tens of nm to several hundreds of nm therefrom. These structures may be adjusted according to the content of the metal oxide and the type of the solvent. An organic light-emitting diode (OLED) having an improved lifetime can be expected by adopting these structures.

According to the production method of the present invention, for example, a mixed layer of a hole transport material and a metal and/or a metal oxide is formed on a positive electrode (ITO electrode), and a luminescent material dissolved in an organic solvent is applied thereon by coating to form a film. As a result, the luminescent layer as an organic layer can be formed. In a reverse way, a mixed layer of an electron transport material and a metal and/or a metal oxide is formed on a negative electrode (Al electrode), and a luminescent material dissolved in an organic solvent is applied thereon by coating to form a film. As a result, the luminescent layer as an organic layer can be formed.

In this context, examples of the luminescent material for forming this luminescent layer can include high-molecular-weight luminescent materials such as poly(para-phenylenevinylene), poly(thiophene), poly(fluorene), or their derivatives. Alternative examples thereof can include fluorescent or phosphorescent materials such as tris(8-hydroxyquinolinolato) aluminum complexes ($Alq_3$), bis(2-methyl-8-quinolinolato)(p-phenylphenolato)aluminum (III) (BAlq), bis(benzoquinolinolato)beryllium complexes ($BeBq_2$), phenanthroline-based europium complexes ($Eu(TTA)_3$ (phen)), perylene, coumarin derivatives, quinacridone, and iridium complexes ($Ir(ppy)_3$, FIrpic, $(ppy)_2Ir(acac)$, and $Btp_2Ir(acac)$).

A host material capable of a hole or electron transport or having both of these functions may be doped with a small amount of these materials for use. Examples of such a host material include 4,4'-bis(9-carbazole)biphenyl (CBP), 2,7-di-9-carbazolyl-9,9'-spirobifluorene (spiro-CBP), bis(2-methyl-8-quinolinolato)(p-phenylphenolato)aluminum (III) (BAlq), and poly(N-vinylcarbazole) (PVK).

The luminescent material is not limited to these materials. Every material contributing to luminescence can be used. Alternatively, the luminescent materials or the host materials may be mixed in combination of two or more of them.

Structures are shown in FIGS. 1 to 5 as typical examples of such organic light-emitting diodes (OLED) produced by the method of the present invention.

An organic light-emitting diode (OLED) shown in FIG. 1 is a multilayer structure in which on a positive electrode layer 1 as one of electrodes, a mixed layer 2 of a hole injection material (or a hole transport material) and a metal and/or a metal oxide, a luminescent layer 3, and a negative electrode layer 4 as the other electrode are formed in order. Alternatively, each layer may be subdivided and provided as plural layers. For example, a hole injection layer (not shown) can be provided between the positive electrode layer 1 and the mixed layer 2 of a hole injection material (or a hole transport material) and a metal and/or a metal oxide.

Figure 2:
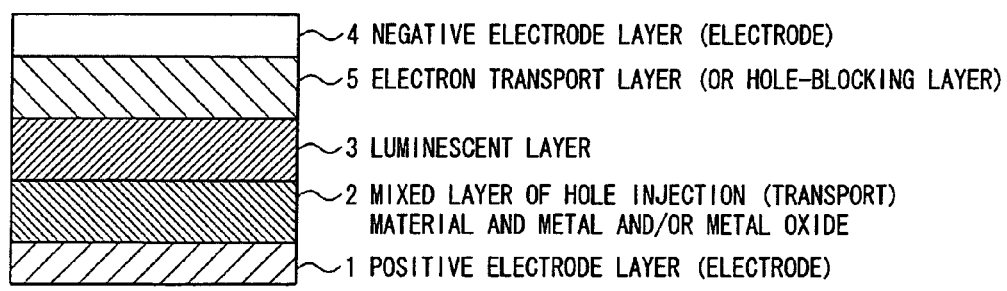
FIG. 2 is a structure diagram showing one embodiment of an organic light-emitting diode (OLED) of the present invention.

An organic light-emitting diode (OLED) shown in FIG. 2 is a multilayer structure in which a mixed layer 2 of a hole injection material (or a hole transport material) and a metal and/or a metal oxide, a luminescent layer 3, an electron transport layer (or a hole-blocking layer) 5, and a negative electrode layer 4 are formed in order on a positive electrode layer 1. Alternatively, each layer may be subdivided and provided as plural layers. For example, a hole injection layer (not shown) can be provided between the positive electrode layer 1 and the mixed layer 2 of a hole injection material (or a hole transport material) and a metal and/or a metal oxide. Alternatively, a hole-blocking layer (not shown) can be provided between the luminescent layer 3 and the electron transport layer 5.

Figure 3:
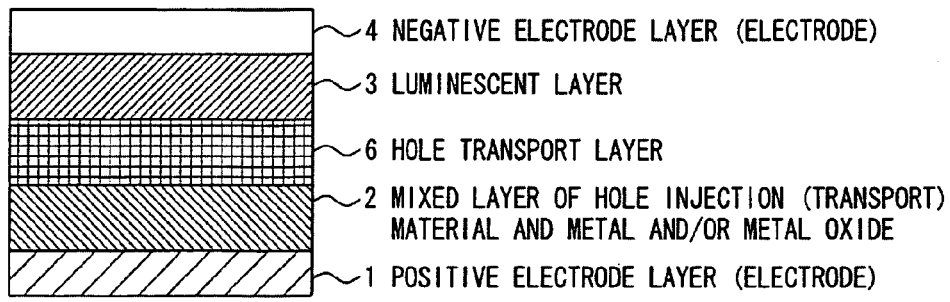
FIG. 3 is a structure diagram showing one embodiment of an organic light-emitting diode (OLED) of the present invention.

An organic light-emitting diode (OLED) shown in FIG. 3 is a multilayer structure in which a mixed layer 2 of a hole injection material (or a hole transport material) and a metal and/or a metal oxide, a hole transport layer 6, a luminescent layer 3, and a negative electrode layer 4 are formed in order on a positive electrode layer 1. Alternatively, each layer may be subdivided and provided as plural layers. For example, a hole injection layer (not shown) can be provided between the positive electrode layer 1 and the mixed layer 2 of a hole injection material (or a hole transport material) and a metal and/or a metal oxide.

Figure 4:
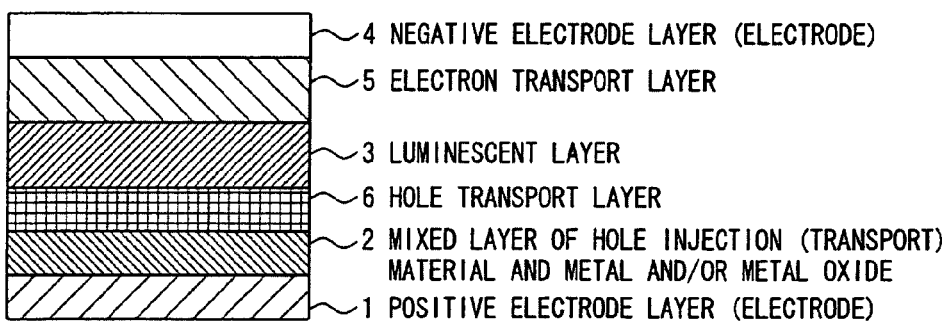
FIG. 4 is a structure diagram showing one embodiment of an organic light-emitting diode (OLED) of the present invention.

An organic light-emitting diode (OLED) shown in FIG. 4 is a multilayer structure in which a mixed layer 2 of a hole injection material (or a hole transport material) and a metal and/or a metal oxide, a hole transport layer 6, a luminescent layer 3, an electron transport layer 5, and a negative electrode layer 4 are formed in order on a positive electrode layer 1. Alternatively, each layer may be subdivided and provided as plural layers. For example, a hole injection layer (not shown) can be provided between the positive electrode layer 1 and the mixed layer 2 of a hole injection material (or a hole transport material) and a metal and/or a metal oxide. Alternatively, a hole-blocking layer (not shown) can be provided between the luminescent layer 3 and the electron transport layer 5.

Figure 5:
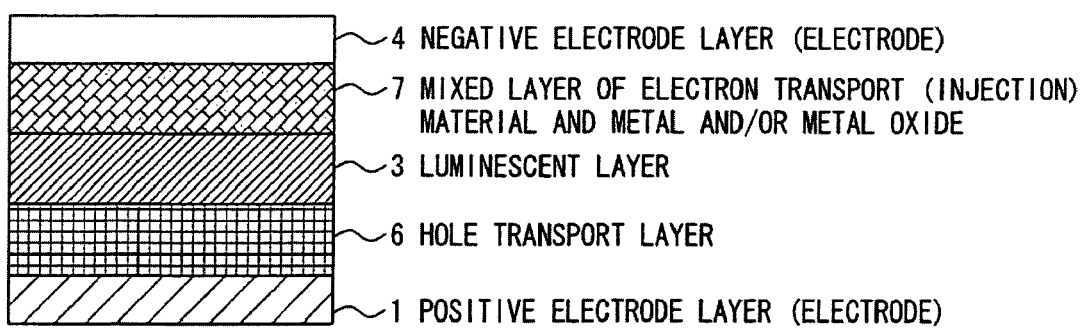
FIG. 5 is a structure diagram showing one embodiment of an organic light-emitting diode (OLED) of the present invention.

An organic light-emitting diode (OLED) shown in FIG. 5 is a multilayer structure in which on a positive electrode layer 1 as one of electrodes, a hole transport layer 6, a luminescent layer 3, a mixed layer 7 of an electron transport material (or an electron injection material) and a metal and/or a metal oxide, and a negative electrode layer 4 are formed in order. However, this device is produced in order from the negative electrode layer 4. Alternatively, each layer may be subdivided and provided as plural layers. For example, a hole injection layer (not shown) can be provided between the positive electrode layer 1 and the hole transport layer 6. Alternatively, a hole-blocking layer (not shown) or an electron transport layer can be provided between the luminescent layer 3 and the mixed layer 7 of an electron transport material (or an electron injection material) and a metal and/or a metal oxide. Alternatively, the hole transport layer 6 may be absent.

Layers other than the mixed layer of organic matter and a metal and/or a metal oxide according to the present invention and the layer applied thereon can also be prepared by a coating method by selecting a solvent.

In this context, the present invention is not limited to these structures. Any organic light-emitting diode (OLED) having, as any layer, a mixed layer of organic matter and a metal and/or a metal oxide may be used. A particular distinction is not drawn between the hole injection and hole transport materials described in FIGS. 1 to 5. These materials may be replaced for each other. Furthermore, a hole injection/transport material may be used instead of them. Alternatively, an organic semiconductor material can also be used. A particular distinction is not drawn between the electron injection and electron transport materials described in FIGS. 1 to 5. These materials may be replaced for each other. Furthermore, an electron injection/transport material may be used instead of them. Alternatively, an organic semiconductor material can also be used.

To stack layers by coating, these layers do not have to be clearly independent in the multilayer structure as shown in the drawings. It is important to prepare layers through two or more steps of applying different coating solutions. The negative electrode layer does not have to be a single layer and may be, for example, a two-layer structure of lithium fluoride and aluminum or a two-layer structure of calcium and aluminum. Alternatively, magnesium, silver, or a mixture thereof can also be used as a negative electrode.

The organic light-emitting diode (OLED) produced by the production method of the present invention is useful for displays or lightings.

The coating solution of the present invention is not limited to the method for producing an organic light-emitting diode (OLED) described herein and can be used in every electronic device.

EXAMPLES

Hereinafter, study on a multilayer structure of the present invention will be described in detail with reference to specific Examples.

Example 1

(1) Step 1: Method for Preparing Coating Solution Containing Organic Matter and Metal and/or Metal Oxide An ITO nano-metal ink (manufactured by ULVAC Materials, Inc) was diluted with toluene to prepare a 10.0 wt % ink. Next, spiro-NPB (0.10 g; manufactured by Tokyo Chemical Industry Co., Ltd.) as a hole transport material represented by the chemical formula 1 below was dissolved in 10.0 g of toluene to prepare a 1.0 wt % solution. These solutions were mixed at a solid matter weight ratio of solid matter of the ITO nano-metal ink:spiro-NPB (solid; the same holds true for the descriptions below)=1:1 to prepare a 1.8 wt % solution. In this context, the solid matter of the ITO nano-metal ink refers to solid matter including metals (e.g., indium and tin) and metal oxides (e.g., ITO) (the same holds true for the descriptions below).

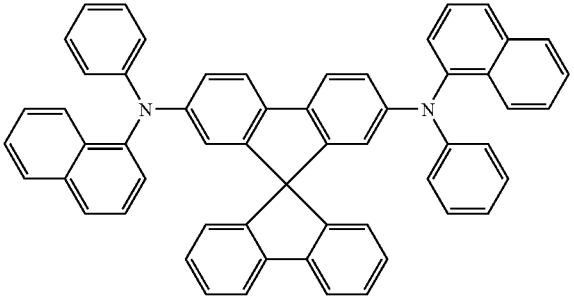

<Chemical Formula 1>

(2) Step 2: Method for Preparing Film Made of Organic Matter and Metal and/or Metal Oxide The solution obtained in the step 1 was filtered through a 0.2-μm filter (DISMIC; manufactured by Advantec Toyo Kaisha, Ltd.). A few drops of the filtrate were put onto a quartz substrate. This substrate was subjected to a spin coating method (1000 rpm, 60 sec.) to prepare a thin film. This thin film was heated at 250° C. for 1 hour on a hot plate to prepare a transparent film.

(3) Step 3: Confirmation of Transparency

The transmittance of the film prepared in the step 2 was measured with a spectrophotometer (UV-2500PC; manufactured by Shimadzu Corp.).

As a result, the transmittance was 93% at 500 nm and exceeded 90% in the whole region from 450 nm to 600 nm.

Example 2

(1) Step 1: Method for Preparing Coating Solution Containing Organic Matter and Metal and/or Metal Oxide An ITO nano-metal ink (manufactured by ULVAC Materials, Inc) was diluted with toluene to prepare a 10.0 wt % ink. Next, spiro-NPB (0.10 g; manufactured by Tokyo Chemical Industry Co., Ltd.) (chemical formula 1) as a hole transport material was dissolved in 10.0 g of toluene to prepare a 1.0 wt % solution. These solutions were mixed at a solid matter weight ratio of solid matter of the ITO nano-metal ink:spiro-NPB=1:1 to prepare a 1.8 wt % solution.

(2) Step 2: Method for Preparing Film Made of Organic Matter and Metal and/or Metal Oxide The solution obtained in the step 1 was filtered through a 0.2-μm filter (DISMIC; manufactured by Advantec Toyo Kaisha, Ltd.). A few drops of the filtrate were put onto an ITO-coated glass substrate. This substrate was subjected to a spin coating method (1000 rpm, 60 sec.) to prepare a thin film. This thin film was heated at 250° C. for 1 hour on a hot plate to prepare a transparent film.

(3) Step 3: Organic Solvent Resistance

Chloroform was added dropwise to the film prepared in the step 2. The film was subjected to a spin coating method (2000 rpm, 60 sec.) to confirm whether the film remained on the substrate by visual inspection.

As a result, the film was confirmed to remain thereon.

Example 3

(1) Step 1: Method for Preparing Coating Solution Containing Organic Matter and Metal and/or Metal Oxide An ITO nano-metal ink (manufactured by ULVAC Materials, Inc) was diluted with toluene to prepare a 10.0 wt % ink. Next, spiro-NPB (0.10 g; manufactured by Tokyo Chemical Industry Co., Ltd.) (chemical formula 1) as a hole transport material was dissolved in 10.0 g of toluene to prepare a 1.0 wt % solution. These solutions were mixed at a solid matter weight ratio of solid matter of the ITO nano-metal ink:spiro-NPB=1:1 to prepare a 1.8 wt % solution.

(2) Step 2: Method for Preparing Film Made of Organic Matter and Metal and/or Metal Oxide The solution obtained in the step 1 was filtered through a 0.2-μm filter (DISMIC; manufactured by Advantec Toyo Kaisha, Ltd.). A few drops of the filtrate were put onto an ITO-coated glass substrate. This substrate was subjected to a spin coating method (1000 rpm, 60 sec.) to prepare a thin film. This thin film was heated at 250° C. for 1 hour on a hot plate to prepare a transparent film.

(3) Step 3: Organic Solvent Resistance

Tetralin was added dropwise to the film prepared in the step 2. The film was subjected to a spin coating method (2000 rpm, 60 sec.) to confirm whether the film remained on the substrate by visual inspection.

As a result, the film was confirmed to remain thereon.

Example 4

(1) Step 1: Method for Preparing Coating Solution Containing Organic Matter and Metal and/or Metal Oxide An ITO nano-metal ink (manufactured by ULVAC Materials, Inc) was diluted with toluene to prepare a 10.0 wt % ink. Next, spiro-NPB (0.10 g; manufactured by Tokyo Chemical Industry Co., Ltd.) (chemical formula 1) as a hole transport material was dissolved in 10.0 g of toluene to prepare a 1.0 wt % solution. These solutions were mixed at a solid matter weight ratio of solid matter of the ITO nano-metal ink:spiro-NPB=2:1 to prepare a 1.8 wt % solution.

(2) Step 2: Method for Preparing Film Made of Organic Matter and Metal and/or Metal Oxide The solution obtained in the step 1 was filtered through a 0.2-μm filter (DISMIC; manufactured by Advantec Toyo Kaisha, Ltd.). A few drops of the filtrate were put onto a quartz substrate. This substrate was subjected to a spin coating method (1000 rpm, 60 sec.) to prepare a thin film. This thin film was heated at 250° C. for 1 hour on a hot plate to prepare a transparent film.

(3) Step 3: Organic Solvent Resistance

Chloroform was added dropwise to the film prepared in the step 2. The film was subjected to a spin coating method (2000 rpm, 60 sec.) to confirm whether the film remained on the substrate. For this confirmation, an absorption spectrum was measured by a method using a spectrophotometer (UV-2500PC; manufactured by Shimadzu Corp.).

As a result, absorption derived from spiro-NPB could be confirmed even after the dropwise addition of chloroform.

Example 5

(1) Step 1: Method for Preparing Coating Solution Containing Organic Matter and Metal and/or Metal Oxide An ITO nano-metal ink (manufactured by ULVAC Materials, Inc) was diluted with toluene to prepare a 10.0 wt % ink. Next, spiro-NPB (0.10 g; manufactured by Tokyo Chemical Industry Co., Ltd.) (chemical formula 1) as a hole transport material was dissolved in 10.0 g of toluene to prepare a 1.0 wt % solution. These solutions were mixed at a solid matter weight ratio of solid matter of the ITO nano-metal ink:spiro-NPB=2:1 to prepare a 1.8 wt % solution.

(2) Step 2: Method for Preparing Film Made of Organic Matter and Metal and/or Metal Oxide The solution obtained in the step 1 was filtered through a 0.2-μm filter (DISMIC; manufactured by Advantec Toyo Kaisha, Ltd.). A few drops of the filtrate were put onto a quartz substrate. This substrate was subjected to a spin coating method (1000 rpm, 60 sec.) to prepare a thin film. This thin film was heated at 250° C. for 1 hour on a hot plate to prepare a transparent film.

(3) Step 3: Organic Solvent Resistance

Tetralin was added dropwise to the film prepared in the step 2. The film was subjected to a spin coating method (2000 rpm, 60 sec.) to confirm whether the film remained on the substrate. For this confirmation, a photoelectron spectrum was measured by a method using a photoelectron spectrometer (AC-3; manufactured by Riken Keiki Co., Ltd.).

As a result, photoelectron spectra arising from similar energies were confirmed before and after the dropwise addition of tetralin. Accordingly, the film could be confirmed to remain thereon even after the dropwise addition of tetralin.

Example 6

(1) Step 1: Method for Preparing Coating Solution Containing Organic Matter and Metal and/or Metal Oxide An ITO nano-metal ink (manufactured by ULVAC Materials, Inc) was diluted with toluene to prepare a 10.0 wt % ink. Next, spiro-NPB (0.10 g; manufactured by Tokyo Chemical Industry Co., Ltd.) (chemical formula 1) as a hole transport material was dissolved in 10.0 g of toluene to prepare a 1.0 wt % solution. These solutions were mixed at a solid matter weight ratio of solid matter of the ITO nano-metal ink:spiro-NPB=1:1 to prepare a 1.8 wt % solution.

(2) Step 2: Method for Preparing Film Made of Organic Matter and Metal and/or Metal Oxide The solution obtained in the step 1 was filtered through a 0.2-μm filter (DISMIC; manufactured by Advantec Toyo Kaisha, Ltd.). A few drops of the filtrate were put onto an ITO-coated glass substrate. This substrate was subjected to a spin coating method (1000 rpm, 60 sec.) to prepare a thin film. This thin film was heated at 250° C. for 1 hour on a hot plate to prepare a transparent film.

(3) Step 3: Organic Solvent Resistance

Chloroform was added dropwise to the film prepared in the step 2. The film was subjected to a spin coating method (2000 rpm, 60 sec.) to confirm whether the film remained on the substrate. For this confirmation, a photoelectron spectrum was measured by a method using a photoelectron spectrometer (AC-3; manufactured by Riken Keiki Co., Ltd.).

As a result, photoelectron spectra arising from similar energies were confirmed before and after the dropwise addition of chloroform. Accordingly, the film could be confirmed to remain thereon even after the dropwise addition of chloroform.

Example 7

(1) Step 1: Method for Preparing Coating Solution Containing Organic Matter and Metal and/or Metal Oxide An ITO nano-metal ink (manufactured by ULVAC Materials, Inc) was diluted with toluene to prepare a 10.0 wt % ink. Next, spiro-NPB (0.10 g; manufactured by Tokyo Chemical Industry Co., Ltd.) (chemical formula 1) as a hole transport material was dissolved in 10.0 g of toluene to prepare a 1.0 wt % solution. These solutions were mixed at a solid matter weight ratio of solid matter of the ITO nano-metal ink:spiro-NPB=1:1 to prepare a 1.8 wt % solution.

(2) Step 2: Method for Preparing Film Made of Organic Matter and Metal and/or Metal Oxide The solution obtained in the step 1 was filtered through a 0.2-μm filter (DISMIC; manufactured by Advantec Toyo Kaisha, Ltd.). A few drops of the filtrate were put onto an ITO-coated glass substrate. This substrate was subjected to a spin coating method (1000 rpm, 60 sec.) to prepare a thin film. This thin film was heated at 250° C. for 1 hour on a hot plate to prepare a transparent film.

(3) Step 3: Organic Solvent Resistance

Toluene was added dropwise to the film prepared in the step 2. The film was subjected to a spin coating method (2000 rpm, 60 sec.) to confirm whether the film remained on the substrate. For this confirmation, a photoelectron spectrum was measured by a method using a photoelectron spectrometer (AC-3; manufactured by Riken Keiki Co., Ltd.).

As a result, photoelectron spectra arising from similar energies were confirmed before and after the dropwise addition of toluene. Accordingly, the film could be confirmed to remain thereon even after the dropwise addition of toluene.

Example 8

(1) Step 1: Method for Preparing Coating Solution Containing Organic Matter and Metal and/or Metal Oxide An ITO nano-metal ink (manufactured by ULVAC Materials, Inc) was diluted with toluene to prepare a 10.0 wt % ink. Next, spiro-NPB (0.10 g; manufactured by Tokyo Chemical Industry Co., Ltd.) (chemical formula 1) as a hole transport material was dissolved in 10.0 g of toluene to prepare a 1.0 wt % solution. These solutions were mixed at a solid matter weight ratio of solid matter of the ITO nano-metal ink:spiro-NPB=1:1 to prepare a 1.0 wt % solution.

(2) Step 2: Method for Preparing Film Made of Organic Matter and Metal and/or Metal Oxide The solution obtained in the step 1 was filtered through a 0.2-μm filter (DISMIC; manufactured by Advantec Toyo Kaisha, Ltd.). A few drops of the filtrate were put onto a patterned indium-tin oxide (ITO) substrate. This substrate was subjected to a spin coating method (1000 rpm, 60 sec.) to prepare a thin film. This thin film was heated at 250° C. for 1 hour on a hot plate to prepare a transparent film.

In this context, the ITO substrate used in this device formation was a glass substrate on which ITO (manufactured by Geomatec Co., Ltd.; film thickness: 1500 Å) was patterned. This substrate was ultrasonically cleaned in acetone, pure water, and IPA and treated with UV/ozone. Then, a film of the predetermined material was formed thereon (the same holds true for Examples 9 and 10 and Comparative Examples 3 and 4 below).

(3) Step 3: Device Formation

A luminescent layer was applied to the film prepared in the step 2. A method for forming the luminescent layer is shown below. Materials for the luminescent layer used were CBP (manufactured by E-Ray Optoelectronics Technology Co., Ltd.) represented by the chemical formula 2 below and Ir(ppy)$_3$ (manufactured by American Dye Source, Inc.) represented by the chemical formula 3 below. These materials were dissolved in chloroform at a weight ratio of CBP:Ir(ppy)$_3$=95:5 to prepare a 1.5 wt % solution. Then, the solution was stirred at 50° C. for dissolution. This solution was applied onto the film obtained in the step 2 by a spin coating method (3000 rpm, 60 sec.) under a nitrogen atmosphere to form a thin film. This film was heated at 60° C. for 1 hour on a hot plate.

<Chemical Formula 2>

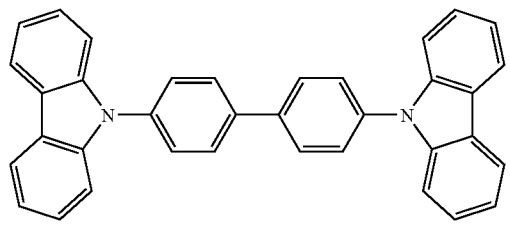

<Chemical Formula 3>

Next, to prepare an electron transport layer, a 1:1 solution (0.2 wt %) containing BCP (manufactured by Kanto Chemical Co., Inc.) represented by the chemical formula 4 below and BAlq (manufactured by Nippon Steel Chemical Co., Ltd.) represented by the chemical formula 5 below, which were dissolved in 2-propanol (IPA) at 50° C., was filtered through a filter (DISMIC; manufactured by Advantec Toyo Kaisha, Ltd.). The filtrate was applied onto the luminescent layer by a spin coating method (500 rpm×60 sec. and subsequently, 2000 rpm×10 sec.) to prepare a thin film. Then, this film was heated at 60° C. for 1 hour on a hot plate.

<Chemical Formula 4>

<Chemical Formula 5>

Lithium fluoride was further vacuum-vapor-deposited at a film thickness of 7 Å onto this thin film. Aluminum was further vacuum-vapor-deposited at a film thickness of 800 Å to form an electrode.

Voltage was applied between both of the electrodes (ITO and aluminum layers) in the obtained device. As a result, luminescence was confirmed.

Figure 6:
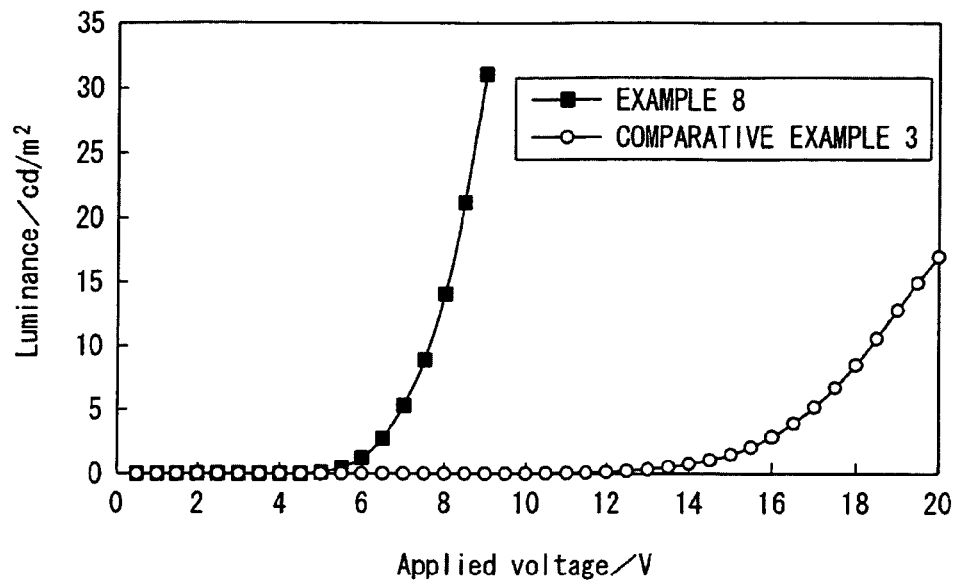
FIG. 6 is a graphic diagram showing the relationship between turn-on voltage and luminance in organic light-emitting diodes (OLED) of Example 8 and Comparative Example 3.

As shown in FIG. 6, the device according to this Example 8 was demonstrated to require turn-on voltage lower than that required by a device of Comparative Example 3 described later.

Example 9

(1) Step 1: Method for Preparing Coating Solution Containing Metal and/or Metal Oxide and Organic Matter An ITO nano-metal ink (manufactured by ULVAC Materials, Inc) was diluted with toluene to prepare a 1.0 wt % ink. Next, spiro-NPB (0.10 g; manufactured by Tokyo Chemical Industry Co., Ltd.) (chemical formula 1) as a hole transport material was dissolved in 10.0 g of toluene to prepare a 1.0 wt % solution. These solutions were mixed at a solid matter weight ratio of solid matter of the ITO nano-metal ink:spiro-NPB=1:1 to prepare a 1.0 wt % solution.

(2) Step 2: Method for Preparing Film Made of Metal and/or Metal Oxide and Organic Matter The solution obtained in the step 1 was filtered through a 0.2-μm filter (DISMIC; manufactured by Advantec Toyo Kaisha, Ltd.). A few drops of the filtrate were put onto a patterned indium-tin oxide (ITO) substrate. This substrate was subjected to a spin coating method (1000 rpm, 60 sec.) under a nitrogen atmosphere to prepare a thin film. This thin film was heated under a nitrogen atmosphere at 250° C. for 1 hour on a hot plate to prepare a transparent film.

(3) Step 3: Device Formation

A luminescent layer was applied to the film prepared in the step 2. A method for forming the luminescent layer is shown below. A material for the luminescent layer used was a fluorene-based polymer (OPA1871, a product manufactured by H. W. SANDS CORP.) represented by the chemical formula 6 below. This polymer was dissolved in chloroform to prepare a 0.8 wt % solution.

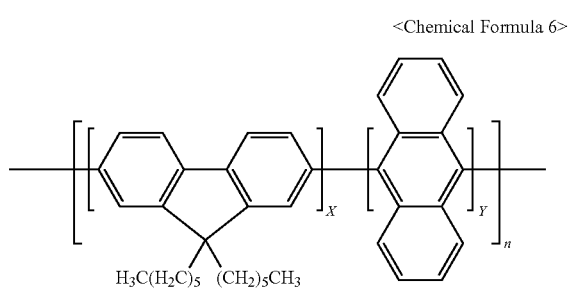

<Chemical Formula 6>

Then, the solution was stirred at 50° C. for dissolution. This solution was applied onto the film obtained in the step 2 by a spin coating method (1500 rpm, 60 sec.) to form a thin film. This film was heated under a nitrogen atmosphere at 120° C. for 30 minutes on a hot plate.

Aluminum was further vacuum-vapor-deposited at a film thickness of 800 Å onto this thin film to form an electrode.

Voltage was applied between both of the electrodes (ITO and aluminum layers) in the obtained device. As a result, luminescence was confirmed.

Figure 7:
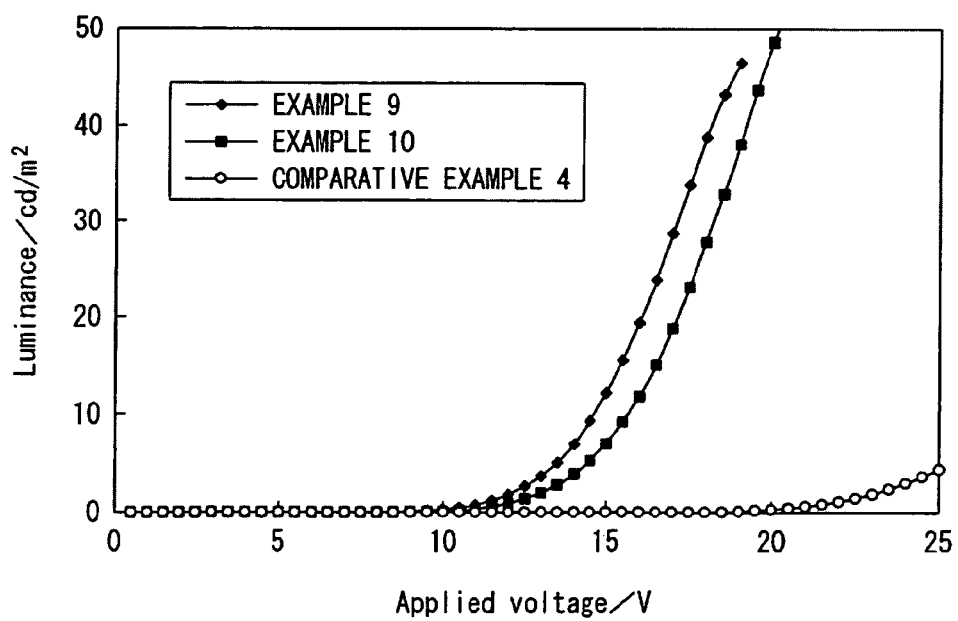
FIG. 7 is a graphic diagram showing the relationship between turn-on voltage and luminance in organic light-emitting diodes (OLED) of Examples 9 and 10 and Comparative Example 4.

As shown in FIG. 7, the device according to this Example 9 was demonstrated to require turn-on voltage lower than that required by a device of Comparative Example 4 described later.

Example 10

(1) Step 1: Method for Preparing Coating Solution Containing Organic Matter and Metal and/or Metal Oxide An ITO nano-metal ink (manufactured by ULVAC Materials, Inc) was diluted with toluene to prepare a 1.0 wt % ink.

Next, spiro-NPB (0.10 g; manufactured by Tokyo Chemical Industry Co., Ltd.) (chemical formula 1) as a hole transport material was dissolved in 10.0 g of toluene to prepare a 1.0 wt % solution. These solutions were mixed at a solid matter weight ratio of solid matter of the ITO nano-metal ink:spiro-NPB=2:1 to prepare a 1.0 wt % solution.

(2) Step 2: Method for Preparing Film Made of Organic Matter and Metal and/or Metal Oxide The solution obtained in the step 1 was filtered through a 0.2-μm filter (DISMIC; manufactured by Advantec Toyo Kaisha, Ltd.). A few drops of the filtrate were put onto a patterned indium-tin oxide (ITO) substrate. This substrate was subjected to a spin coating method (1000 rpm, 60 sec.) under a nitrogen atmosphere to prepare a thin film. This thin film was heated under a nitrogen atmosphere at 250° C. for 1 hour on a hot plate to prepare a transparent film.

(3) Step 3: Device Formation

A luminescent layer was applied to the film prepared in the step 2. A method for forming the luminescent layer is shown below. A material for the luminescent layer used was a fluorene-based polymer (OPA1871, a product manufactured by H. W. SANDS CORP.) (chemical formula 6). This polymer was dissolved in chloroform to prepare a 0.8 wt % solution. Then, the solution was stirred at 50° C. for dissolution.

This solution was applied onto the film obtained in the step 2 by a spin coating method (1500 rpm, 60 sec.) to form a thin film. This film was heated under a nitrogen atmosphere at 120° C. for 30 minutes on a hot plate.

Aluminum was further vacuum-vapor-deposited at a film thickness of 800 Å onto this thin film to form an electrode.

Voltage was applied between both of the electrodes (ITO and aluminum layers) in the obtained device. As a result, luminescence was confirmed.

As shown in FIG. 7, the device according to this Example 10 was also demonstrated to require turn-on voltage lower than that required by a device of Comparative Example 4 described later.

Example 11

(1) Step 1: Method for Preparing Coating Solution Containing Organic Matter and Metal and/or Metal Oxide An ITO nano-metal ink (manufactured by ULVAC Materials, Inc) was diluted with decalin to prepare a 10.0 wt % ink.

Next, 2-TNATA (0.07 g; manufactured by Luminescence Technology Corp.) as a hole transport material represented by the chemical formula 7 below was dissolved in 10.0 g of toluene to prepare a 0.7 wt % solution. These two solutions were mixed at a solid matter weight ratio of solid matter of the ITO nano-metal ink:2-TNATA (solid; the same holds true for the descriptions below)=2:3 to prepare a 1.1 wt % solution.

<Chemical Formula 7>

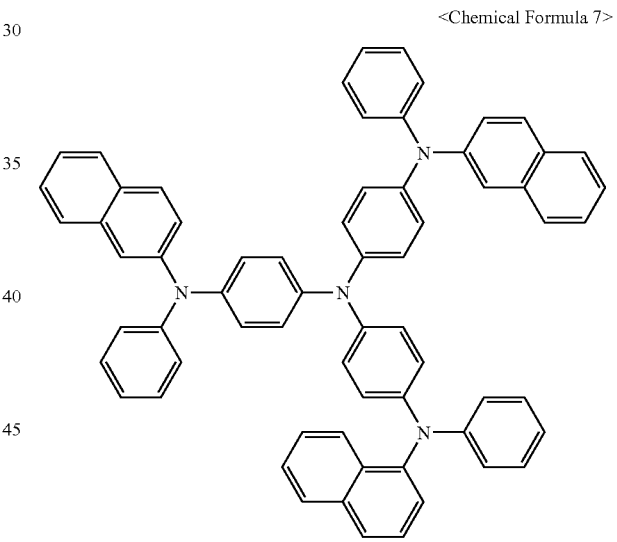

(2) Step 2: Method for Preparing Film Made of Organic Matter and Metal and/or Metal Oxide The solution obtained in the step 1 was filtered through a 0.2-μm filter (DISMIC; manufactured by Advantec Toyo Kaisha, Ltd.). A few drops of the filtrate were put onto a patterned indium-tin oxide (ITO) substrate. This substrate was subjected to a spin coating method (1000 rpm, 60 sec.) to prepare a thin film. This thin film was heated under a nitrogen atmosphere at 250° C. for 1 hour on a hot plate to prepare a transparent film.

(3) Step 3: Device Formation

A luminescent layer was applied to the film prepared in the step 2. A method for forming the luminescent layer is shown below. Materials for the luminescent layer used were CBP (manufactured by E-Ray Optoelectronics Technology Co., Ltd.) and Ir(ppy)$_3$ (manufactured by American Dye Source, Inc.) described above, and spiro-CBP (manufactured by Luminescence Technology Corp.).

These materials were dissolved in chloroform at a weight ratio of CBP:spiro-CBP:Ir(ppy)$_3$=70:30:5 to prepare a 1.5 wt % solution. Then, the solution was stirred at 50° C. for dissolution. After dissolution, the solution was cooled to room temperature and applied onto the film obtained in the step 2 by a spin coating method (3000 rpm, 60 sec.) under a nitrogen atmosphere to form a thin film.

Next, BCP (OPA3972, a product manufactured by H. W. SANDS CORP.) described above was vacuum-vapor-deposited at a film thickness of 200 Å as a hole-blocking layer to form a thin film.

Lithium fluoride was further vacuum-vapor-deposited at a film thickness of 7 Å onto this thin film. Aluminum was further vacuum-vapor-deposited at a film thickness of 800 Å to form an electrode.

Voltage was applied between both of the electrodes (ITO and aluminum layers) in the thus-obtained device. As a result, luminescence was confirmed.

Figure 8:
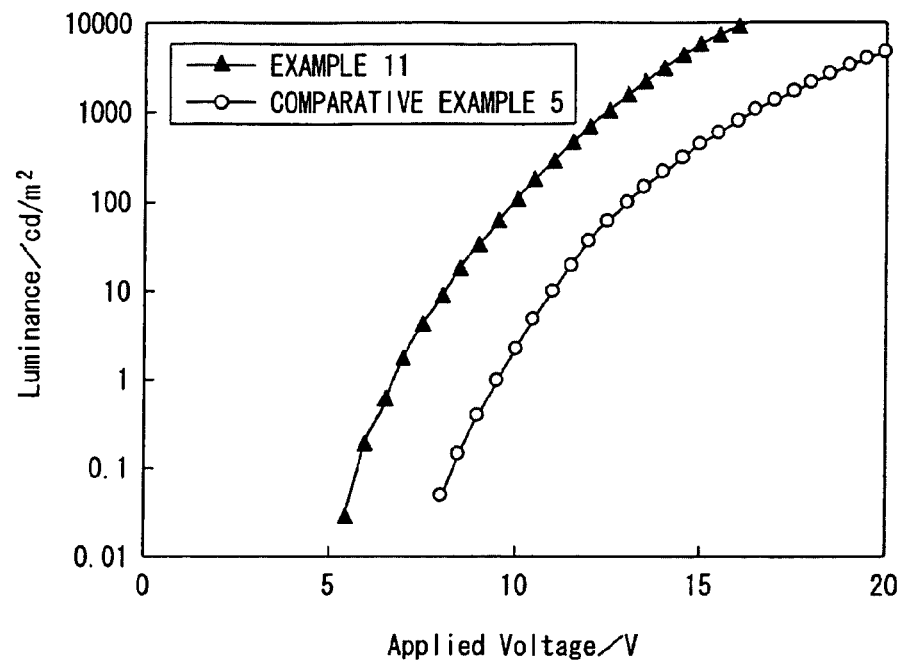
FIG. 8 is a diagram showing the relationship between voltage and luminance in organic light-emitting diodes (OLED) of Example 11 and Comparative Example 5.
Figure 9:
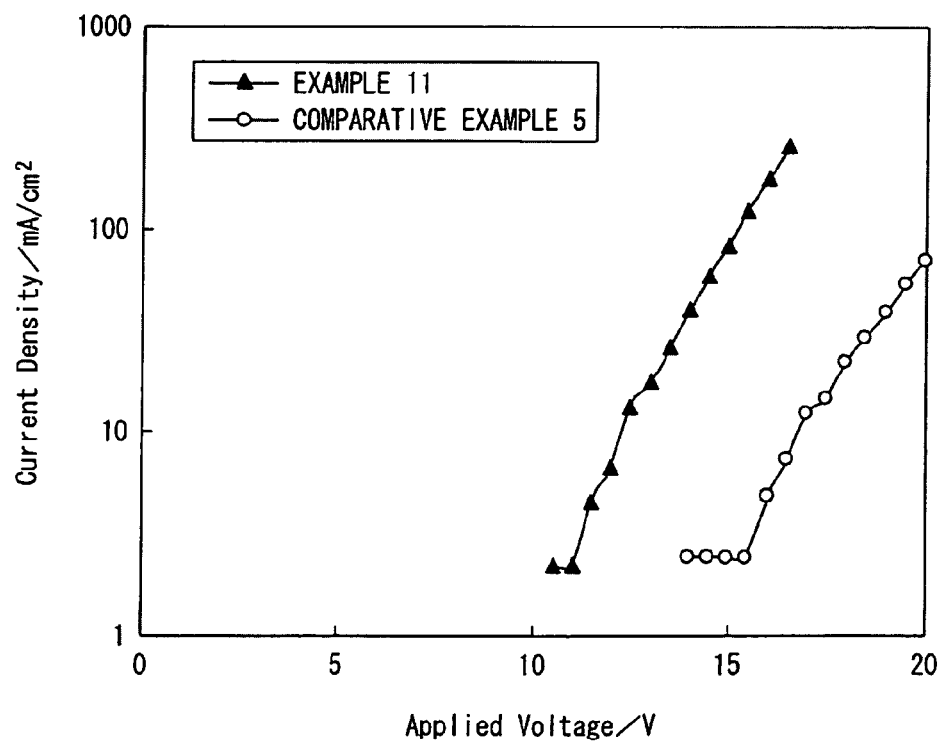
FIG. 9 is a diagram showing the relationship between voltage and current density in organic light-emitting diodes (OLED) of Example 11 and Comparative Example 5.

The relationship between the luminance and voltage was determined. As a result, as shown in FIG. 8, the device according to this Example 11 required lower voltage relative to the luminance than that required by a device of Comparative Example 5 described later. The luminance in this Example 11 also exceeded 10,000 cd/m$^2$. Moreover, the relationship between current density and voltage was determined. As shown in FIG. 9, this Example 11 resulted in current density higher than that in Comparative Example 5 at the same voltage.

Example 12

(1) Step 1: Method for Preparing Coating Solution Containing Organic Matter and Metal and/or Metal Oxide An ITO nano-metal ink (manufactured by ULVAC Materials, Inc) was diluted with decalin to prepare a 10.0 wt % ink.

Next, spiro-NPB (0.10 g; manufactured by Tokyo Chemical Industry Co., Ltd.) as a hole transport material described above was dissolved in 10.0 g of toluene to prepare a 1.0 wt % solution. These two solutions were mixed at a solid matter weight ratio of solid matter of the ITO nano-metal ink:spiro-NPB (solid; the same holds true for the descriptions below)=1:1 to prepare a 1.8 wt % solution. Toluene was further added to this solution to prepare a 1.0 wt % solution.

(2) Step 2: Method for Preparing Film Made of Organic Matter and Metal and/or Metal Oxide The solution obtained in the step 1 was filtered through a 0.2-μm filter (DISMIC; manufactured by Advantec Toyo Kaisha, Ltd.). A few drops of the filtrate were put onto a patterned indium-tin oxide (ITO) substrate. This substrate was subjected to a spin coating method (1000 rpm, 60 sec.) to prepare a thin film. This thin film was heated under a nitrogen atmosphere at 250° C. for 1 hour on a hot plate to prepare a transparent film.

(3) Step 3: Device Formation

A luminescent layer was applied to the film prepared in the step 2. A method for forming the luminescent layer is shown below. Materials for the luminescent layer used were CBP (manufactured by E-Ray Optoelectronics Technology Co., Ltd.) and Ir(ppy)$_3$ (manufactured by American Dye Source, Inc.) described above, and spiro-CBP (manufactured by Luminescence Technology Corp.).

These materials were dissolved in chloroform at a weight ratio of CBP:spiro-CBP:Ir(ppy)$_3$=70:30:5 to prepare a 1.5 wt % solution. Then, the solution was stirred at 50° C. for dissolution. After dissolution, the solution was cooled to room temperature and applied onto the film obtained in the step 2 by a spin coating method (3000 rpm, 60 sec.) under a nitrogen atmosphere to form a thin film.

Next, BCP (OPA3972, a product manufactured by H. W. SANDS CORP.) described above was vacuum-vapor-deposited at a film thickness of 200 Å as a hole-blocking layer to form a thin film.

Lithium fluoride was further vacuum-vapor-deposited at a film thickness of 7 Å onto this thin film. Aluminum was further vacuum-vapor-deposited at a film thickness of 800 Å to form an electrode.

Voltage was applied between both of the electrodes (ITO and aluminum layers) in the thus-obtained device. As a result, luminescence was confirmed.

Figure 10:
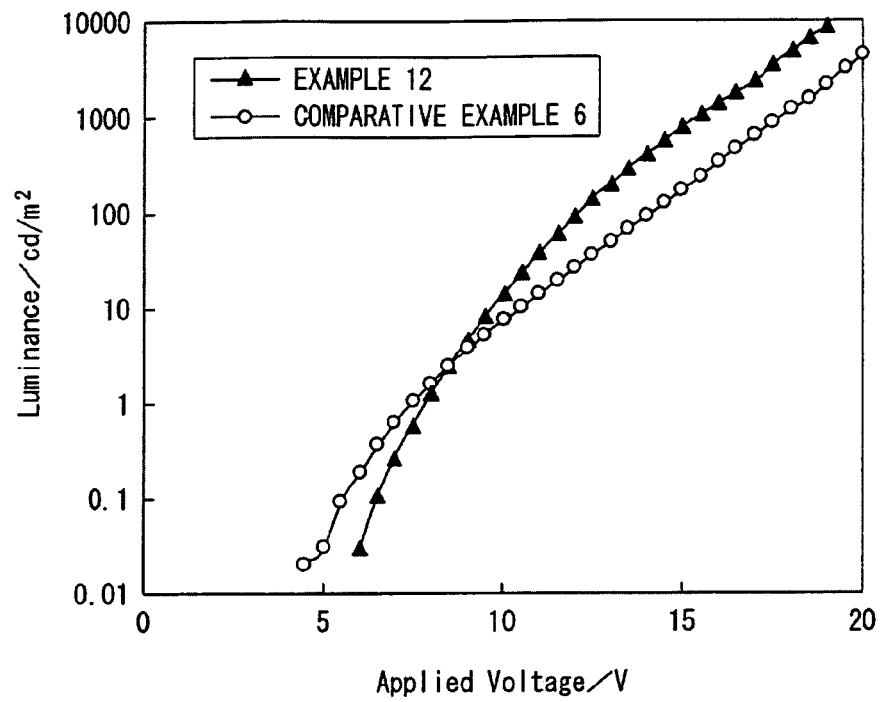
FIG. 10 is a diagram showing the relationship between voltage and luminance in organic light-emitting diodes (OLED) of Example 12 and Comparative Example 6.

The relationship between the luminance and voltage was determined. As a result, as shown in FIG. 10, the luminance in this Example 12 exceeded 10,000 cd/m$^2$. This Example 12 required lower voltage relative to a luminance of 10 cd/m$^2$ or higher, which is important for an actual device, than that in Comparative Example 6.

Example 13

(1) Step 1: Method for Preparing Coating Solution Containing Organic Matter and Metal and/or Metal Oxide An ITO nano-metal ink (manufactured by ULVAC Materials, Inc) was diluted with decalin to prepare a 10.0 wt % ink.

Next, spiro-NPB (0.10 g; manufactured by Tokyo Chemical Industry Co., Ltd.) as a hole transport material described above was dissolved in 10.0 g of toluene to prepare a 1.0 wt % solution. Moreover, 2-TNATA (0.07 g; manufactured by Luminescence Technology Corp.) as a hole transport material described above was dissolved in 10.0 g of toluene to prepare a 0.7 wt % solution. These three solutions were mixed at a solid matter weight ratio of solid matter of the ITO nano-metal ink:spiro-NPB (solid; the same holds true for the descriptions below):2-TNATA (solid; the same holds true for the descriptions below)=2:1.5:1.5 to prepare a 1.2 wt % solution.

(2) Step 2: Method for Preparing Film Made of Organic Matter and Metal and/or Metal Oxide The solution obtained in the step 1 was filtered through a 0.2-μm filter (DISMIC; manufactured by Advantec Toyo Kaisha, Ltd.). A few drops of the filtrate were put onto a patterned indium-tin oxide (ITO) substrate. This substrate was subjected to a spin coating method (1000 rpm, 60 sec.) to prepare a thin film. This thin film was heated under a nitrogen atmosphere at 250° C. for 1 hour on a hot plate to prepare a transparent film.

(3) Step 3: Device Formation

A luminescent layer was applied to the film prepared in the step 2. A method for forming the luminescent layer is shown below. Materials for the luminescent layer used were CBP (manufactured by E-Ray Optoelectronics Technology Co., Ltd.) and Ir(ppy)$_3$ (manufactured by American Dye Source, Inc.) described above, and spiro-CBP (manufactured by Luminescence Technology Corp.).

These materials were dissolved in chloroform at a weight ratio of CBP:spiro-CBP:Ir(ppy)$_3$=70:30:5 to prepare a 1.5 wt % solution. Then, the solution was stirred at 50° C. for dissolution. After dissolution, the solution was cooled to room temperature and applied onto the film obtained in the step 2 by a spin coating method (3000 rpm, 60 sec.) under a nitrogen atmosphere to form a thin film.

Next, BCP (manufactured by Kanto Chemical Co., Inc.) described above was vacuum-vapor-deposited at a film thickness of 200 Å as a hole-blocking layer to form a thin film.

Lithium fluoride was further vacuum-vapor-deposited at a film thickness of 7 Å onto this thin film. Aluminum was further vacuum-vapor-deposited at a film thickness of 800 Å to form an electrode.

Voltage was applied between both of the electrodes (ITO and aluminum layers) in the thus-obtained device. As a result, luminescence was confirmed.

Figure 11:
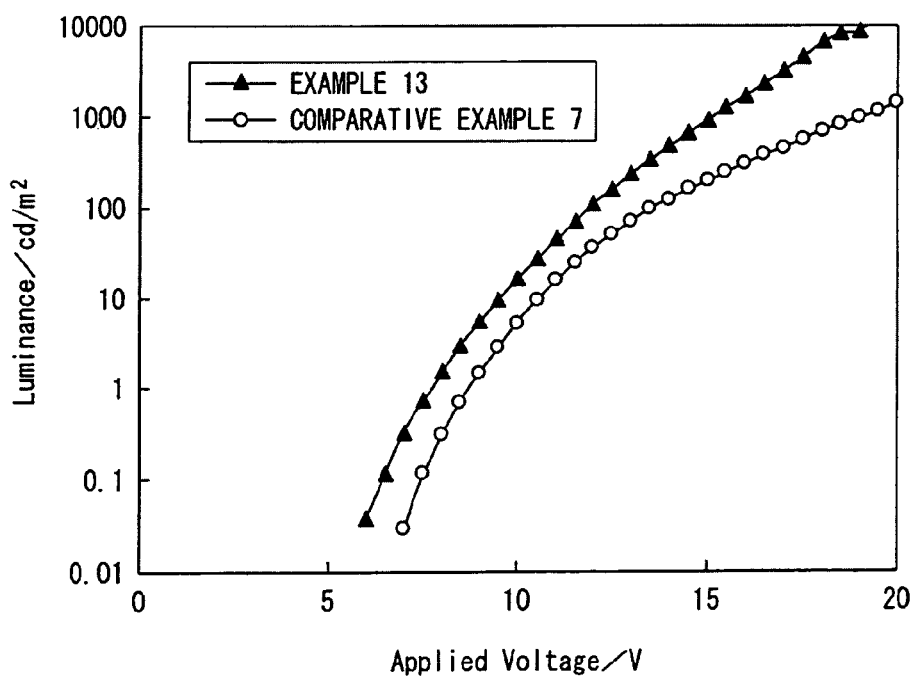
FIG. 11 is a diagram showing the relationship between voltage and luminance in organic light-emitting diodes (OLED) of Example 13 and Comparative Example 7.

The relationship between the luminance and voltage was determined. As a result, as shown in FIG. 11, the device according to this Example 13 required lower voltage relative to the luminance than that required in Comparative Example 7 described later. The luminance in this Example 13 also exceeded 10,000 cd/m$^2$.

Example 14

Figure 12:
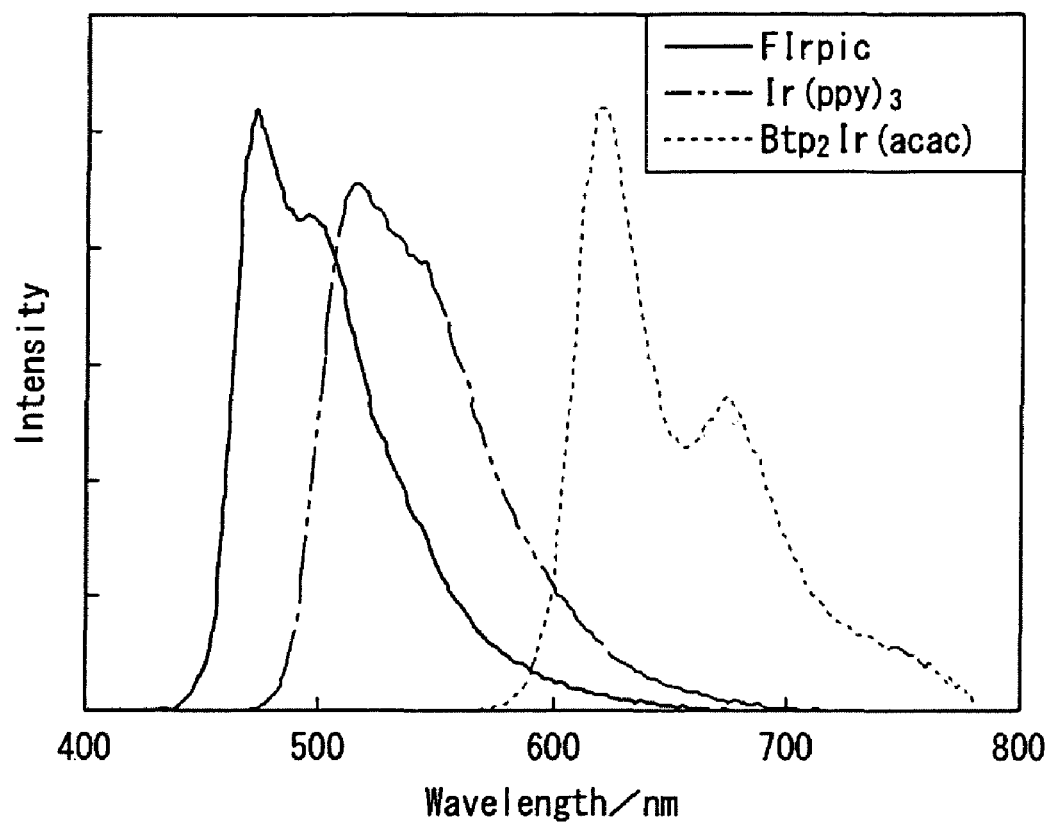
FIG. 12 is a diagram showing emission spectra obtained using different luminescent materials.

Devices were produced by the same production method as in Example 13 except that the luminescent materials were used at a ratio of CBP:spiro-CBP:Ir(ppy)$_3$=70:30:7 and FIrpic or Btp$_2$Ir(acac) was used instead of Ir(ppy)$_3$. Measurement results of emission spectra thereof are shown in FIG. 12. These results demonstrated that red (Btp$_2$Ir(acac):dotted line in the Figure), blue (FIrpic: solid line in the Figure), and green (Ir(ppy)$_3$: two-dot chain line in the Figure) luminescences are obtained.

Comparative Example 1

(1) Step 1: Method for Preparing Coating Solution Containing Organic Matter

Spiro-NPB (0.10 g; manufactured by Tokyo Chemical Industry Co., Ltd.) (chemical formula 1) as a hole transport material was dissolved in 10.0 g of toluene to prepare a 1.0 wt % solution.

(2) Step 2: Method for Preparing Film Made of Organic Matter

A few drops of the solution obtained in the step 1 were put onto a quartz substrate. This substrate was subjected to a spin coating method (300 rpm, 60 sec. and subsequently, 2000 rpm, 1 sec.) to prepare a thin film.

(3) Step 3: Organic Solvent Resistance

Chloroform was added dropwise to the film prepared in the step 2. The film was subjected to a spin coating method (2000 rpm, 60 sec.) to confirm whether the film remained on the substrate. For this confirmation, an absorption spectrum was measured by a method using a spectrophotometer (UV-2500; manufactured by Shimadzu Corp.).

As a result, absorption derived from spiro-NPB was not observed after the dropwise addition of chloroform.

Comparative Example 2

(1) Step 1: Method for Preparing Coating Solution Containing Organic Matter

Spiro-NPB (0.10 g; manufactured by Tokyo Chemical Industry Co., Ltd.) (chemical formula 1) as a hole transport material was dissolved in 10.0 g of toluene to prepare a 1.0 wt % solution.

(2) Step 2: Method for Preparing Film Made of Organic Matter

A few drops of the solution obtained in the step 1 were put onto a quartz substrate. This substrate was subjected to a spin coating method (300 rpm, 60 sec. and subsequently, 2000 rpm, 1 sec.) to prepare a thin film.

(3) Step 3: Organic Solvent Resistance

Tetralin was added dropwise to the film prepared in the step 2. The film was subjected to a spin coating method (2000 rpm, 60 sec.) to confirm whether the film remained on the substrate. For this confirmation, an absorption spectrum was measured by a method using a spectrophotometer (UV-2500; manufactured by Shimadzu Corp.).

As a result, the spectrum of spiro-NPB was not observed after the dropwise addition of tetralin.

Comparative Example 3

(1) Step 1: Device Formation

A luminescent layer was applied to a patterned ITO substrate. A method for forming the luminescent layer is shown below. Materials for the luminescent layer used were NPD (manufactured by E-Ray Optoelectronics Technology Co., Ltd.) represented by the chemical formula 8 below, CBP (manufactured by E-Ray Optoelectronics Technology Co., Ltd.) (chemical formula 2), and Ir(ppy)$_3$ (manufactured by American Dye Source, Inc.) (chemical formula 3).

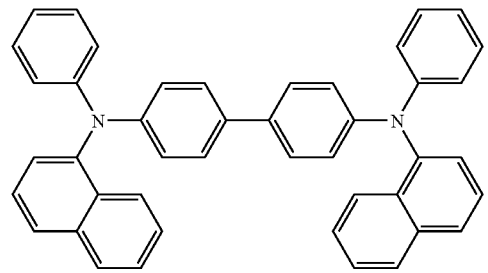

<Chemical Formula 8>

These materials were dissolved in tetrahydrofuran (THF) at a weight ratio of NPD:CBP:Ir(ppy)$_3$=5:100:5 to prepare a 1.5 wt % solution. Then, the solution was stirred at 50° C. for dissolution. This solution was applied onto the patterned ITO substrate by a spin coating method (500 rpm×60 sec. and subsequently, 2000 rpm×10 sec.) to form a thin film. This film was heated at 60° C. for 1 hour on a hot plate.

Next, to prepare an electron transport layer, a 1:1 solution (0.2 wt %) containing BCP (manufactured by Kanto Chemical Co., Inc.) (chemical formula 4) and BAlq (manufactured by Nippon Steel Chemical Co., Ltd.) (chemical formula 5), which were dissolved in 2-propanol (IPA) at 50° C., was stirred at 60° C. The solution was cooled to room temperature and filtered through a 0.2-μm filter (DISMIC; manufactured by Advantec Toyo Kaisha, Ltd.). The filtrate was applied onto the luminescent layer by a spin coating method (500 rpm×60 sec. and subsequently, 2000 rpm×10 sec.) to prepare a thin film. Then, this film was heated at 60° C. for 2.5 hours on a hot plate.

Lithium fluoride was further vacuum-vapor-deposited at a film thickness of 7 Å onto this thin film. Aluminum was further vacuum-vapor-deposited at a film thickness of 800 Å to form an electrode.

Voltage was applied between both of the electrodes (ITO and aluminum layers) in the obtained device. As a result, as shown in FIG. 6, luminescence was confirmed. However, turn-on voltage was demonstrated to be higher than that in Example 8.

Comparative Example 4

(3) Step 1: Device Formation

A luminescent layer was applied to a patterned ITO substrate. A method for forming the luminescent layer is shown below. A material for the luminescent layer used was a fluorene-based polymer (OPA1871, a product manufactured by H. W. SANDS CORP.) (chemical formula 6). This polymer was dissolved in chloroform to prepare a 0.8 wt % solution. Then, the solution was stirred at 50° C. for dissolution. The solution was further filtered through a 0.2-μm filter (DISMIC; manufactured by Advantec Toyo Kaisha, Ltd.). The filtrate was applied onto the ITO substrate by a spin coating method (3000 rpm, 6.0 sec.) to form a thin film. This film was heated at 120° C. for 30 minutes on a hot plate.

Aluminum was further vacuum-vapor-deposited at a film thickness of 800 Å onto this thin film to form an electrode.

Voltage was applied between both of the electrodes (ITO and aluminum layers) in the obtained device. As a result, as shown in FIG. 7, luminescence was confirmed. However, turn-on voltage was demonstrated to be higher than those in Examples 9 and 10.

Comparative Example 5

(1) Step 1: Device Formation

A luminescent layer was applied to a patterned ITO substrate. A method for forming the luminescent layer is shown below. Materials for the luminescent layer used were CBP (manufactured by E-Ray Optoelectronics Technology Co., Ltd.) and Ir(ppy)$_3$ (manufactured by American Dye Source, Inc.) described above, and spiro-CBP (manufactured by Luminescence Technology Corp.).

These materials were dissolved in chloroform at a weight ratio of CBP:spiro-CBP:Ir(ppy)$_3$=70:30:5 to prepare a 1.5 wt % solution. Then, the solution was stirred at 50° C. for dissolution. After dissolution, the solution was cooled to room temperature and applied by a spin coating method (3000 rpm, 60 sec.) under a nitrogen atmosphere onto a film prepared on the ITO substrate with the same solution as in Example 4 to form a thin film.

Next, BCP (OPA3972, a product manufactured by H. W. SANDS CORP.) described above was vacuum-vapor-deposited at a film thickness of 200 Å as a hole-blocking layer to form a thin film.

Lithium fluoride was further vacuum-vapor-deposited at a film thickness of 7 Å onto this thin film. Aluminum was further vacuum-vapor-deposited at a film thickness of 800 Å to form an electrode (the electrode was prepared simultaneously with Example 4).

Voltage was applied between both of the electrodes (ITO and aluminum layers) in the thus-obtained device. As a result, luminescence was confirmed. However, as shown in FIG. 8, voltage relative to the luminance was higher than that in Example 11. Moreover, as shown in FIG. 9, current density was lower than that in Example 11 at the same voltage.

Comparative Example 6

(1) Step 1: Method for Preparing Thin Film

A water dispersion of PEDOT/PSS (Baytron P AI4083; manufactured by H. C. Starck) as a hole injection/transport material was filtered through a 0.45-μm filter (SYRINGE FILTER; manufactured by Whatman). A few drops of the filtrate were put onto a patterned indium-tin oxide (ITO) substrate. This substrate was subjected to a spin coating method (3000 rpm, 45 sec.) to prepare a thin film. This thin film was heated at 200° C. for 15 minutes on a hot plate.

(2) Step 2: Device Formation

A luminescent layer was applied to the film prepared in the step 1. A method for forming the luminescent layer is shown below. Materials for the luminescent layer used were CBP (manufactured by E-Ray Optoelectronics Technology Co., Ltd.) and Ir(ppy)$_3$ (manufactured by American Dye Source, Inc.) described above, and spiro-CBP (manufactured by Luminescence Technology Corp.).

These materials were dissolved in chloroform at a weight ratio of CBP:spiro-CBP:Ir(ppy)$_3$=70:30:5 to prepare a 1.5 wt % solution. Then, the solution was stirred at 50° C. for dissolution. After dissolution, the solution was cooled to room temperature and applied onto the film obtained in the step 1 by a spin coating method (3000 rpm, 60 sec.) under a nitrogen atmosphere to form a thin film.

Next, BCP (OPA3972, a product manufactured by H. W. SANDS CORP.) described above was vacuum-vapor-deposited at a film thickness of 200 Å as a hole-blocking layer to form a thin film.

Lithium fluoride was further vacuum-vapor-deposited at a film thickness of 7 Å onto this thin film. Aluminum was further vacuum-vapor-deposited at a film thickness of 800 Å to form an electrode.

Voltage was applied between both of the electrodes (ITO and aluminum layers) in the thus-obtained device. As a result, luminescence was confirmed. However, as shown in FIG. 10, voltage relative to a luminance of 10 cd/m$^2$ or more was higher than that in Example 12.

Comparative Example 7

(1) Step 1: Device Formation

A luminescent layer was applied to a patterned ITO substrate. A method for forming the luminescent layer is shown below. Materials for the luminescent layer used were CBP (manufactured by E-Ray Optoelectronics Technology Co., Ltd.) and Ir(ppy)$_3$ (manufactured by American Dye Source, Inc.) described above, and spiro-CBP (manufactured by Luminescence Technology Corp.).

These materials were dissolved in chloroform at a weight ratio of CBP:spiro-CBP:Ir(ppy)$_3$=70:30:5 to prepare a 1.5 wt % solution. Then, the solution was stirred at 50° C. for dissolution. After dissolution, the solution was cooled to room temperature and applied by a spin coating method (3000 rpm, 60 sec.) under a nitrogen atmosphere onto a film prepared on the ITO substrate with the same solution as in Example 6 to form a thin film.

Next, BCP (manufactured by Kanto Chemical Co., Inc.) described above was vacuum-vapor-deposited at a film thickness of 200 Å as a hole-blocking layer to form a thin film.

Lithium fluoride was further vacuum-vapor-deposited at a film thickness of 7 Å onto this thin film. Aluminum was further vacuum-vapor-deposited at a film thickness of 800 Å to form an electrode (the electrode was prepared simultaneously with Example 6).

Voltage was applied between both of the electrodes (ITO and aluminum layers) in the thus-obtained device. As a result, luminescence was confirmed. However, as shown in FIG. 11, voltage relative to the luminance was higher than that in Example 13 described above.

The method for producing an electronic device according to the present invention can permit production by a coating method. Therefore, this method, as compared with a vapor deposition method, easily achieves device formation and provides high material utilization efficiency.

What is claimed is:

1. A method for producing an organic electroluminescent device, in which at least two layers containing an organic matter are stacked between a pair of electrodes, at least one of which is indium-tin oxide (ITO), the method comprising:
   coating a coating solution A directly on one electrode of the ITO so as to produce a first layer,
wherein the coating solution A includes:
   an organic solvent;
   an organic matter having one selected from a hole injection material, a hole transport material, a hole injection/transport material, an electron injection materials, an electron transport materials, and an electron injection/transport materials; and
   an inorganic matter having at least one selected from Sn, In, tin oxide, indium oxide, and ITO, and
   coating directly on the first layer a solution B that includes a luminescent material and an organic solvent, so as to produce a second layer.

* * * * *